US012480040B2

(12) United States Patent
Chen

(10) Patent No.: US 12,480,040 B2
(45) Date of Patent: Nov. 25, 2025

(54) DISPLAY SUBSTRATE AND DISPLAY APPARATUS

(71) Applicant: BOE Technology Group Co., Ltd., Beijing (CN)

(72) Inventor: Lei Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 983 days.

(21) Appl. No.: 17/628,553

(22) PCT Filed: Mar. 31, 2021

(86) PCT No.: PCT/CN2021/084460
§ 371 (c)(1),
(2) Date: Jan. 19, 2022

(87) PCT Pub. No.: WO2022/205090
PCT Pub. Date: Oct. 6, 2022

(65) Prior Publication Data
US 2023/0263052 A1 Aug. 17, 2023

(51) Int. Cl.
C09K 11/06 (2006.01)
H10K 50/18 (2023.01)
(Continued)

(52) U.S. Cl.
CPC ............ C09K 11/06 (2013.01); H10K 50/18 (2023.02); H10K 85/00 (2023.02); H10K 85/615 (2023.02);
(Continued)

(58) Field of Classification Search
CPC .......................... H10K 59/875; H10K 59/879
See application file for complete search history.

(56) References Cited

U.S. PATENT DOCUMENTS

2018/0114938 A1* 4/2018 Yasukawa .............. H10K 50/00
2019/0051834 A1 2/2019 Liu et al.
(Continued)

FOREIGN PATENT DOCUMENTS

CN 107394051 A 11/2017
CN 108129380 A 6/2018
(Continued)

OTHER PUBLICATIONS

Machine-generated English-language translation of KR-20200024726-A.*
(Continued)

Primary Examiner — Vu A Nguyen
(74) Attorney, Agent, or Firm — Ling Wu; Stephen Yang; Ling and Yang Intellectual Property

(57) ABSTRACT

Provided are a display substrate and a display apparatus. The display substrate includes a drive circuit layer and a light emitting structure layer stacked on a substrate. The light emitting structure layer includes an anode, a cathode, and an emitting layer, a hole block layer, and an electron transport layer disposed between the anode and the cathode; the hole block layer and the electron transport layer satisfy: EETL/EHBL>1; where EETL is the electromigration rate of the electron transport layer, and EHBL is the electromigration rate of the hole block layer.

12 Claims, 4 Drawing Sheets

(51) Int. Cl.
  *H10K 50/85*   (2023.01)
  *H10K 59/80*   (2023.01)
  *H10K 85/00*   (2023.01)
  *H10K 85/60*   (2023.01)
  *H10K 101/40*  (2023.01)

(52) U.S. Cl.
  CPC ......... *H10K 85/636* (2023.02); *H10K 85/654* (2023.02); *C09K 2211/1018* (2013.01); *H10K 50/85* (2023.02); *H10K 59/875* (2023.02); *H10K 85/6574* (2023.02); *H10K 85/6576* (2023.02); *H10K 2101/40* (2023.02)

(56) References Cited

U.S. PATENT DOCUMENTS

| | | | |
|---|---|---|---|
| 2019/0280056 A1* | 9/2019 | Yasukawa | H10K 59/35 |
| 2019/0393426 A1 | 12/2019 | Masuda et al. | |
| 2020/0067007 A1 | 2/2020 | Mou et al. | |
| 2020/0098998 A1 | 3/2020 | Lui et al. | |
| 2020/0106044 A1* | 4/2020 | Gao | H10K 50/844 |
| 2020/0388767 A1 | 12/2020 | Masuda et al. | |
| 2021/0013439 A1 | 1/2021 | Sado et al. | |
| 2022/0165964 A1 | 5/2022 | Itoi et al. | |
| 2022/0199911 A1 | 6/2022 | Lee et al. | |
| 2023/0269957 A1* | 8/2023 | Qiu | H10K 59/35 257/40 |

FOREIGN PATENT DOCUMENTS

| | | | | |
|---|---|---|---|---|
| CN | 109103341 A | | 12/2018 | |
| CN | 109232492 A | | 1/2019 | |
| CN | 109378397 A | | 2/2019 | |
| CN | 109400560 A | | 3/2019 | |
| CN | 110168048 A | | 8/2019 | |
| CN | 110845394 A | | 2/2020 | |
| CN | 111170874 A | | 5/2020 | |
| CN | 111225904 A | | 6/2020 | |
| CN | 111226325 A | | 6/2020 | |
| CN | 111630676 A | | 9/2020 | |
| CN | 111712938 A | | 9/2020 | |
| CN | 111969119 A | * | 11/2020 | ............. H10K 50/11 |
| CN | 113527235 A | * | 10/2021 | ........... C07D 307/77 |
| EP | 3127901 A1 | * | 2/2017 | ........... C07D 251/12 |
| EP | 3503240 A1 | | 6/2019 | |
| IN | 110226241 A | | 9/2019 | |
| IN | 110256415 A | | 9/2019 | |
| KR | 1020170141144 A | | 12/2017 | |
| KR | 20200024726 A | * | 3/2020 | ............. H10K 50/16 |
| KR | 1020200131681 A | | 11/2020 | |
| WO | 2020209299 A1 | | 10/2020 | |

OTHER PUBLICATIONS

Machine-generated English-language translation of CN-113527235-A.*

* cited by examiner

DISPLAY SUBSTRATE AND DISPLAY APPARATUS

CROSS-REFERENCE TO RELATED APPLICATION

This application is a national stage application of PCT Application No. PCT/CN2021/084460, filed on Mar. 31, 2021 and entitled "Display Substrate and Display Apparatus", the contents of which should be interpreted as being hereby incorporated by reference.

TECHNICAL FIELD

The present disclosure relates to, but is not limited to, the field of display technology, in particular to a display substrate and a display apparatus.

BACKGROUND

An Organic Light Emitting Diode (OLED) is an active light emitting display apparatus, which has advantages such as self-luminescence, wide viewing angle, high contrast ratio, low power consumption, high response speed, lightness and thinness, flexibility, and low cost. With the constant development of a display technology, a display apparatus that adopts an OLED as a light emitting device and adopts a Thin Film Transistor (TFT) for signal control has become a mainstream product in the field of display at present.

The OLED includes an anode, a cathode, and an emitting layer disposed between the anode and the cathode. The light emitting principle of the OLED is that holes and electrons are injected into the emitting layer from the anode and the cathode respectively, when the electrons and the holes meet in the emitting layer, the electrons and the holes are recombined to produce excitons, and when transitioning from an excited state to a ground state, these excitons emit light.

SUMMARY

The following is a summary of subject matter described in detail in the present disclosure. This brief description is not intended to limit the scope of protection of the claims.

Provided is a display substrate including a drive circuit layer and a light emitting structure layer stacked on a substrate, the light emitting structure layer including an anode, a cathode, and an emitting layer, a hole block layer, and an electron transport layer disposed between the anode and the cathode; the hole block layer and the electron transport layer satisfy: EETL/EHBL>1; where EETL is the electromigration rate of the electron transport layer, and EHBL is the electromigration rate of the hole block layer.

In an exemplary embodiment, the hole block layer and the electron transport layer satisfy:

|HOMOETL−HOMOHBL|≥0.1 Ev.

HOMOETL is a Highest Occupied Molecular Orbital (HOMO) energy level of the electron transport layer and HOMOHBL is a HOMO energy level of the hole block layer.

In an exemplary embodiment, the hole block layer and the electron transport layer satisfy:

|LUMOETL−LUMOHBL|≥0.2 eV.

LUMOETL is the Lowest Unoccupied Molecular Orbital (LUMO) energy level of the electron transport layer, and LUMOHBL is the LUMO energy level of the hole block layer.

In an exemplary embodiment, the electromigration rate of the electron transport layer is $10^{-7}$ cm$^2$/Vs to $10^{-5}$ cm$^2$/Vs, and the electromigration rate of the hole block layer is $10^{-8}$ cm$^2$/Vs to $10^{-7}$ cm$^2$/Vs.

In an exemplary embodiment, the material of the hole block layer includes a compound having the following structural formula:

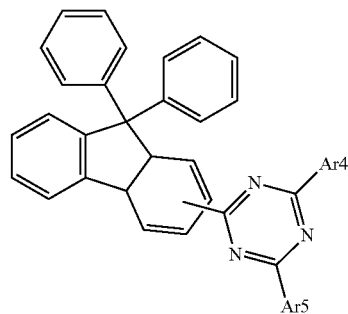

Ar4 to Ar5 are independently substituted or unsubstituted aryl groups having 6 to 30 ring carbon atoms, or substituted or unsubstituted heteroaryl groups having 5 to 20 ring atoms.

In an exemplary embodiment, the material of the hole block layer includes one or more of a compound having the following structural formula:

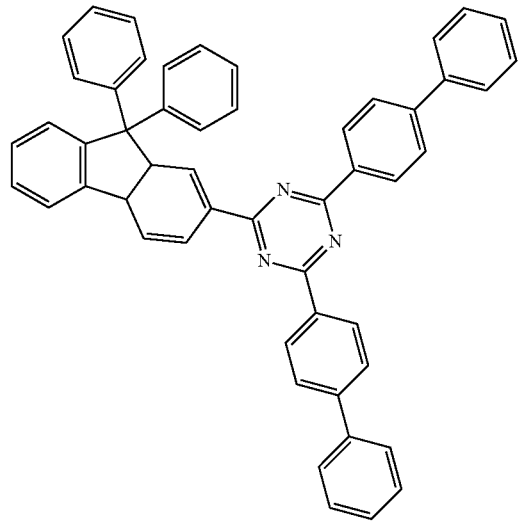

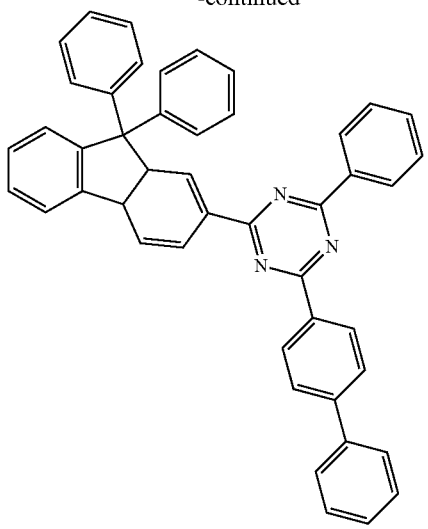
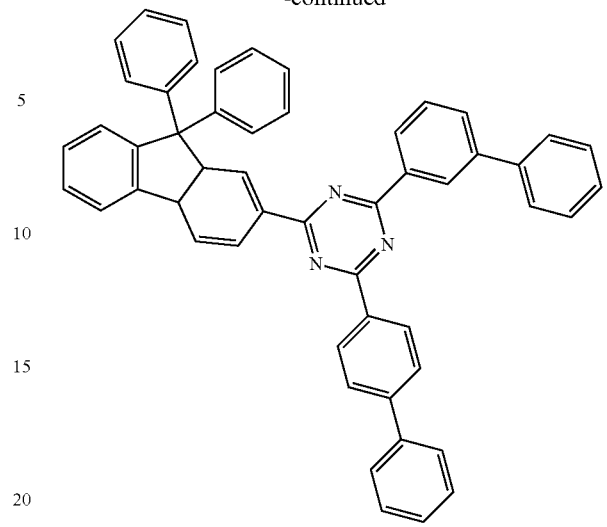
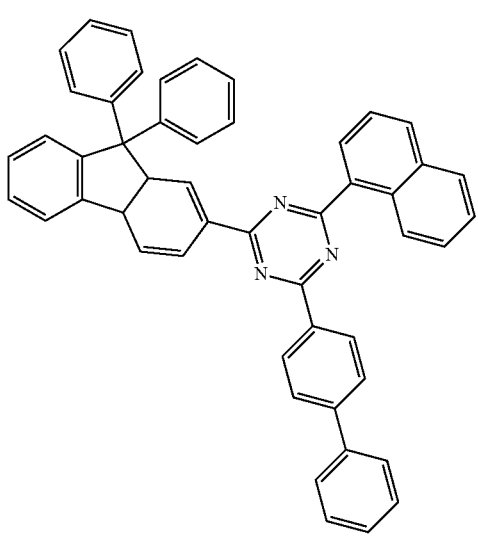
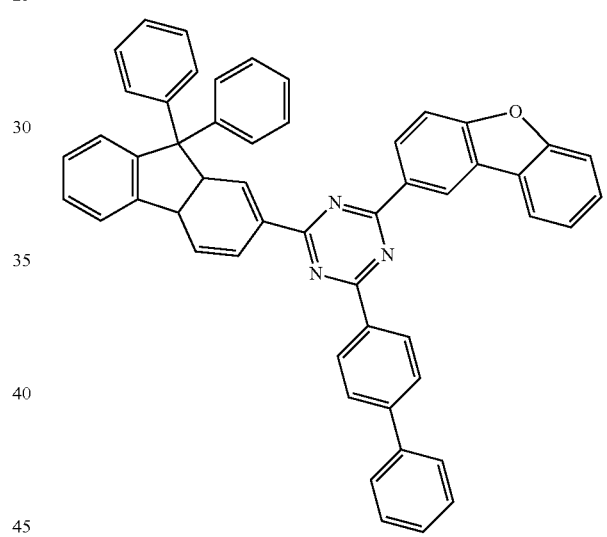
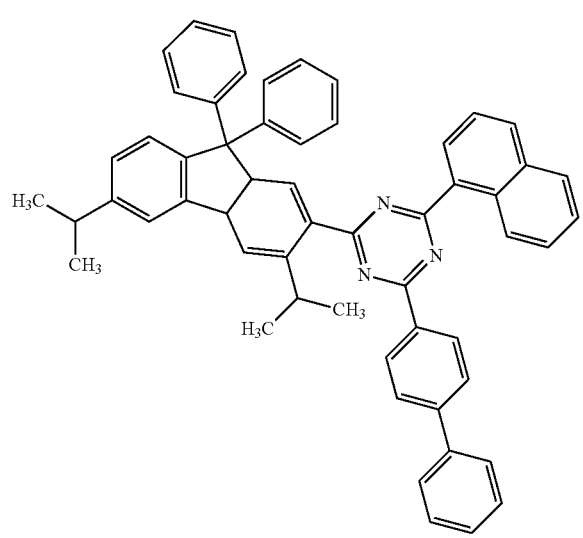

In an exemplary embodiment, the display substrate further includes a light modulation layer disposed on a side of the light emitting structure layer away from the substrate; the light modulation layer has a refractive index nR in a wavelength range of 600 nm to 640 nm, a refractive index nG in a wavelength range of 510 nm to 550 nm, and a refractive index nB in a wavelength range of 440 nm to 480 nm, and the light modulation layer satisfies:

$$|nB-nG|\leq 0.1, |nB-nR|\leq 0.2.$$

In an exemplary embodiment, the light modulation layer has a refractive index refractive index greater than or equal to 1.85 in a wavelength range of 600 nm to 640 nm, a refractive index greater than or equal to 1.95 in a wavelength range of 510 nm to 550 nm, and a refractive index greater than or equal to 2 in a wavelength range of 440 nm to 480 nm.

In an exemplary embodiment, the material of the light modulation layer includes a compound having the following structural formula:

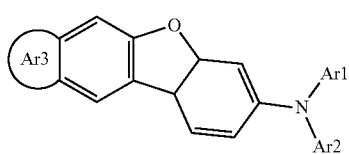
Wherein, Ar1 to Ar3 are independently substituted or unsubstituted aryl groups having 6 to 30 ring carbon atoms, or substituted or unsubstituted heteroaryl groups having 5 to 20 ring atoms.
In an exemplary embodiment, the material of the light modulation layer includes one or more of a compound having the following structural formula:
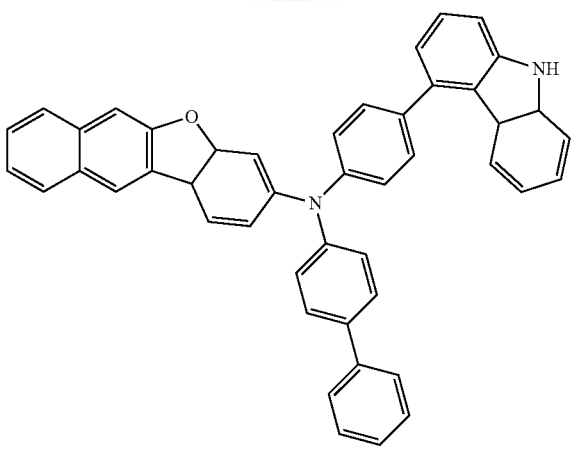
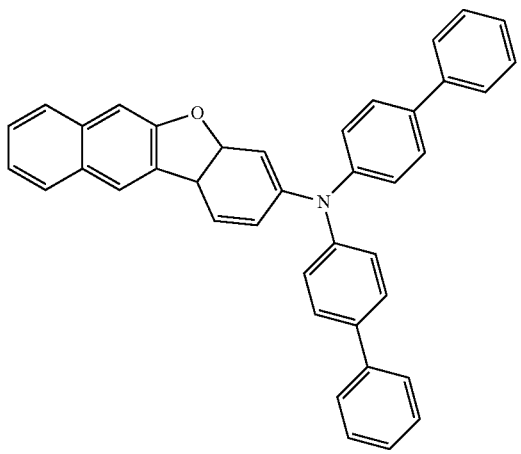
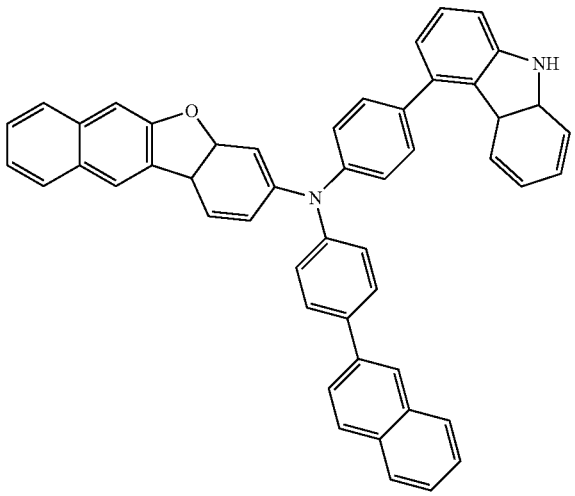
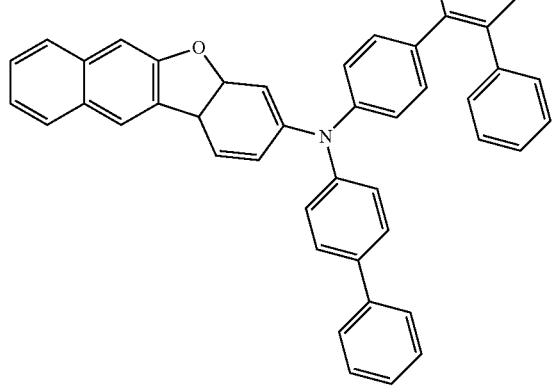
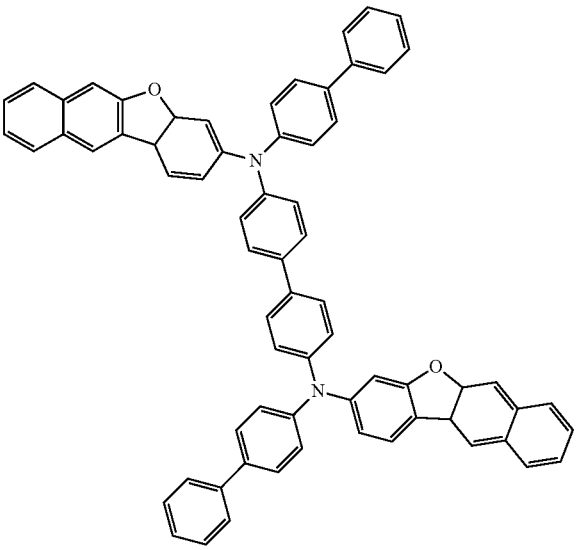

-continued

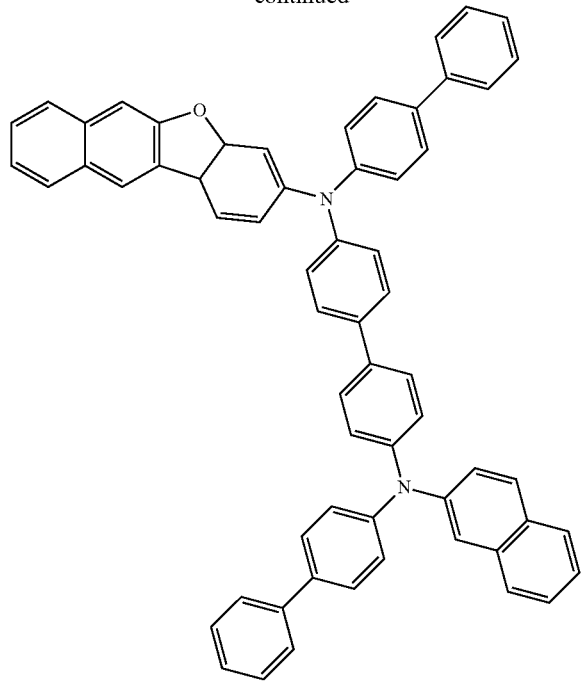

Further provided is a display apparatus includes the display substrate described above.

After reading and understanding the drawings and the detailed description, other aspects may be understood.

BRIEF DESCRIPTION OF DRAWINGS

The drawings provide an understanding of the technical solutions of the present disclosure, form a part of the specification, and are used to explain, together with the embodiments of the present disclosure, the technical solutions of the present disclosure and not intended to form limits to the technical solutions of the present disclosure. The shape and size of each component in the drawings do not reflect true proportions and only to be used to schematically illustrate contents of the present disclosure.

DETAILED DESCRIPTION

Figure 1:
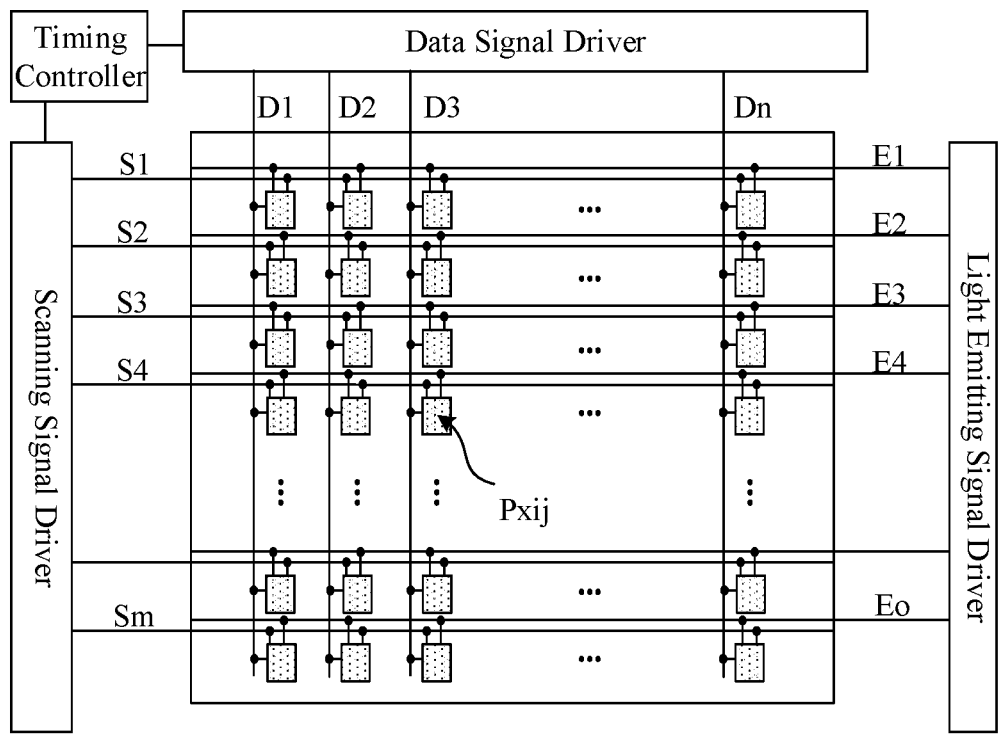
FIG. 1 is a schematic diagram of a structure of an OLED display apparatus.

The embodiments herein may be implemented in a plurality of different forms. A person of ordinary skills in the art will readily understand the fact that implementations and contents may be transformed into a variety of forms without departing from the spirit and scope of the present disclosure. Therefore, the present disclosure should not be explained as being limited to the contents recorded in the following implementations only. The embodiments in the present disclosure and the features in the embodiments can be freely combined without conflicts.

In the drawings, sometimes the size of the constituent elements, the thickness or region of the layer may be exaggerated for the sake of clarity. Therefore, any implementation of the present disclosure is not necessarily limited to the size illustrated in the drawing, and the shape and size of the components in the drawing do not reflect the actual scale. In addition, the drawings schematically illustrate ideal examples, and any implementation of the present disclosure is not limited to the shape or value illustrated in the drawings.

The ordinal numerals such as "first", "second" and "third" herein are set up to avoid the confusion of the constituent elements, not to limit the quantity.

In the present disclosure, for the sake of convenience, "middle", "up", "down", "front", "back", "vertical", "horizontal", "top", "bottom", "inside", "outside" and other words indicating an orientation or positional relationship are used to describe the positional relationship between constituent elements with reference to the drawings, only for the convenience of describing the embodiments and simplifying the description, rather than indicating or implying that the device or element must have a specific orientation or be constructed and operated in a specific orientation, so they should not be understood as limitations to the present disclosure. The positional relationship between the constituent elements may be appropriately changed according to the direction of the described constituent elements. Therefore, it is not limited to the words and sentences described herein, and can be changed appropriately according to the situation.

In the present disclosure, unless otherwise specified and limited, the terms "mount", "connected" and "connect" shall be understood in a broad sense. For example, it may be fixed connection, removable connection, or integrated connection; it may be mechanical connection or electrical connection; it may be direct connection, indirect connection through an intermediate component, or communication inside two components. For those skilled in the art, the meanings of the above terms in the present disclosure may be understood according to the situation.

In the present disclosure, a transistor refers to an element which includes at least three terminals, i.e., a gate electrode, a drain electrode and a source electrode. A transistor has a channel region between the drain electrode (or drain electrode terminal, drain region or drain) and the source electrode (or source electrode terminal, source region or source), and the current can flow through the drain electrode, the channel region and the source electrode. Herein, the channel region refers to the region where the current mainly flows.

In the present disclosure, a first electrode may be a drain electrode and a second electrode may be a source electrode, or a first electrode may be a source electrode and a second electrode may be a drain electrode. The functions of "source electrode" and "drain electrode" may sometimes be exchanged when transistors of opposite polarity are used or when the current direction changes during circuit operation. Therefore, in the present disclosure "source electrode" and "drain electrode" may be exchanged with each other.

In the present disclosure, "electrical connection" includes the case where constituent elements are connected together by a component having a certain electrical action. "The element with the certain electric action" is not particularly limited as long as electric signals between the connected composition elements may be sent and received. "Component having a certain electrical action", for example, may be an electrode or wiring, or a switching element such as a transistor, or other functional element such as a resistor, an inductor or a capacitor.

In the present disclosure, "parallel" refers to a state in which an angle formed by two straight lines is more than −10° and less than 10°. Therefore, it also includes a state in which an angle is more than −5° and less than 5°. In addition, "vertical" refers to a state in which an angle formed by two straight lines is more than 80° and less than 100°. Therefore, it also includes a state in which an angle is more than 85° and less than 95°.

In the present disclosure, "film" and "layer" may be exchanged. For example, sometimes "conducting layer" may be replaced by "conducting film". Similarly, sometimes "insulating film" may be replaced by "insulating layer".

In the present disclosure, "about" refers to a numerical value within a range of allowable process and measurement errors without strictly limiting the limit.

FIG. 1 illustrates a schematic diagram of a structure of a display apparatus. Referring to FIG. 1, an OLED display apparatus may include a timing controller, a data signal driver, a scanning signal driver, and a light emitting signal driver and a pixel array. The pixel array may include multiple scanning signal wires (S1 to Sm), multiple data signal wires (D1 to Dn), multiple light emitting signal wires (E1 to Eo) and multiple sub-pixels Pxij. In an exemplary implementation mode, a timing controller may provide a gray scale value and a control signal suitable for specifications of a data signal driver to the data signal driver, and may provide a clock signal, a scanning start signal, and the like suitable for specifications of a scanning signal driver to the scanning signal driver, and may provide a clock signal, a light emitting stop signal, and the like suitable for specifications of a light emitting signal driver to the light emitting signal driver. The data signal driver may generate data voltages to be provided to data signal wires D1, D2, D3 . . . . and Dn using the gray scale value and the control signal received from the timing controller. For example, the data signal driver may sample the gray scale value by using a clock signal, and apply a data voltage corresponding to the gray scale value to the data signal wires D1 to Dn in units of pixel rows, wherein n may be a natural number. The scanning signal driver may generate scanning signals to be provided to scanning signal wires S1, S2, S3, . . . , and Sm by receiving a clock signal, a scanning start signal, and the like from the timing controller. For example, the scanning signal driver may sequentially provide scanning signals with on-level pulses to the scanning signal wires S1 to Sm. For example, the scanning signal driver may be constructed in a form of a shift register, and may generate scanning signals in such a way that the scanning start signals provided in a form of on-level pulses are sequentially transmitted to a next-stage circuit under control of a clock signal, wherein m may be a natural number. The light emitting signal driver may generate transmission signals to be provided to light emitting lines E1, E2, E3, . . . , and Eo by receiving the clock signal, the transmission stop signal, and the like from the timing controller. For example, the light emitting signal driver may sequentially provide light emitting signals with OFF-level pulses to the light emitting signal wires E1 to Eo. For example, the light emitting signal driver may be constructed in a form of a shift register, and may generate light emitting signals in such a way that light emitting stop signals provided in a form of OFF-level pulses are sequentially transmitted to a next-stage circuit under control of a clock signal, wherein o may be a natural number. The pixel array may include multiple sub-pixels Pxij. Each sub-pixel Pxij may be connected to the corresponding data signal wire, the corresponding scanning signal wire, and the corresponding light emitting signal wire. Herein, i and j may be natural numbers. The sub-pixel Pxij may refer to a sub-pixel of which a transistor is connected to an i-th scanning signal wire and a j-th data signal wire.

Figure 2:
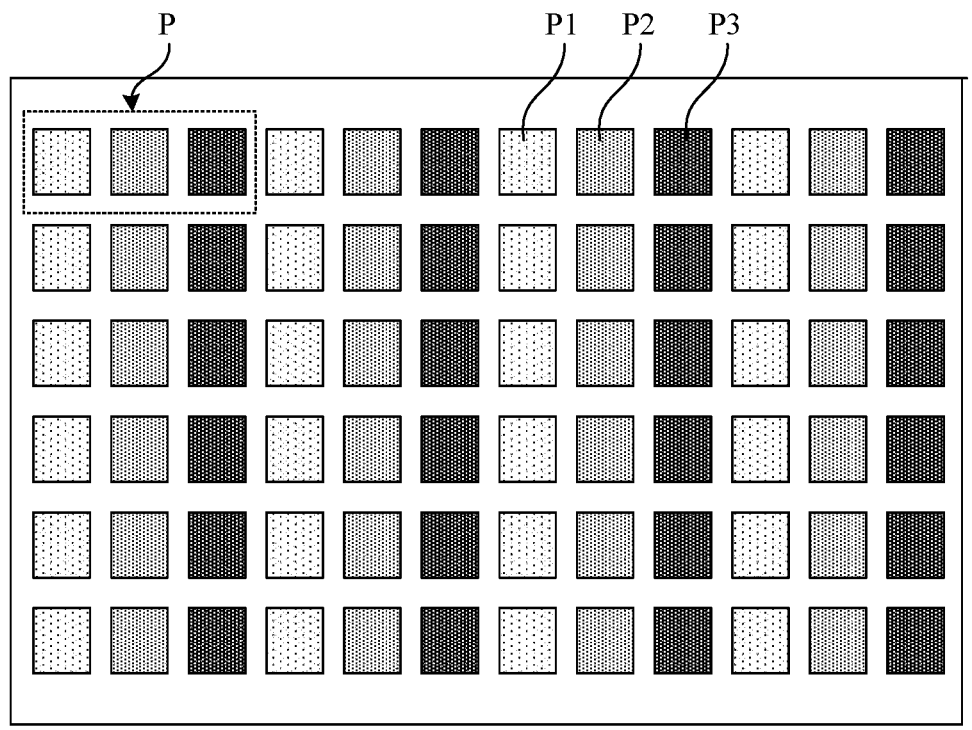
FIG. 2 is a schematic diagram of a planar structure of a display substrate.

FIG. 2 is a schematic plan view of a structure of a display substrate. As shown in FIG. 2, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel drive circuit and a light emitting device. The pixel drive circuits in the first sub-pixel P1, the second sub-pixel P2, and the third sub-pixel P3 are respectively connected to the scanning signal wire, the data signal wire and the light emitting signal wire. The pixel drive circuit is configured to receive a data voltage transmitted by the data signal wire and output a corresponding current to the light emitting device under a control of the scanning signal wire and the light emitting signal wire. The light emitting devices in the first sub-pixel P1, the second sub-pixel P2 and the third sub-pixel P3 are respectively connected to the pixel drive circuits of the sub-pixels where the light emitting devices are located. The light emitting device is configured to emit light with a corresponding brightness in response to a current output by the pixel drive circuit of the sub-pixel where the light emitting device is located.

In an exemplary implementation modes, a pixel unit P may include a Red (R) sub-pixel, a Green (G) sub-pixel, and a Blue (B) sub-pixel, or may include a red sub-pixel, a green sub-pixel, a blue sub-pixel, and a white sub-pixel. No limits are made in the present disclosure. In an exemplary embodiment, a shape of the sub-pixel in the pixel unit may be rectangular, diamond, pentagonal or hexagonal. When the pixel unit includes three sub-pixels, the three sub-pixels may be arranged in a manner to stand side by side horizontally, in a manner to stand side by side vertically, or in a pyramid manner with two units sitting at the bottom and one unit placed on top. When the pixel unit includes four sub-pixels, the four sub-pixels may be arranged in a manner to stand side by side horizontally, in a manner to stand side by side vertically, or in a manner to form a square, which is not specifically limited in the present disclosure.

Figure 3:
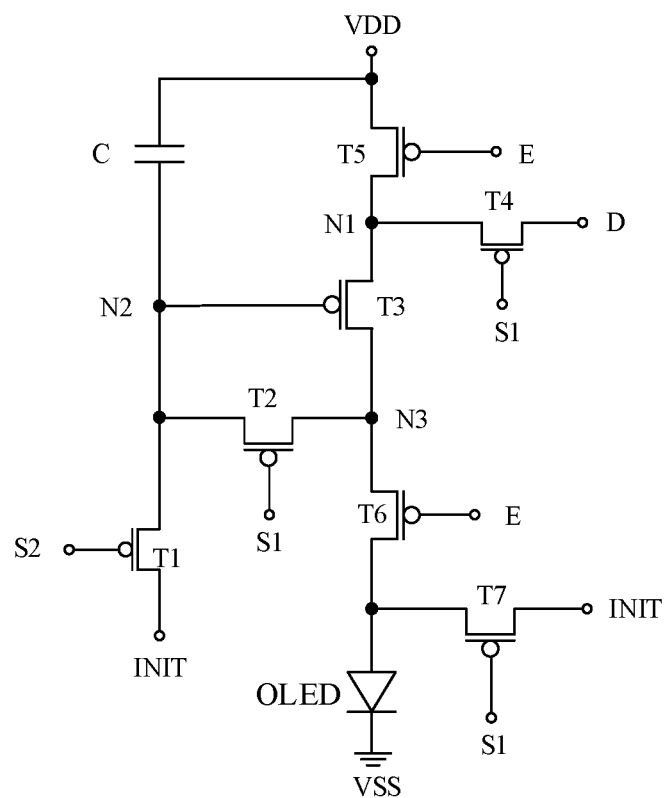
FIG. 3 is an equivalent circuit diagram of a pixel drive circuit.

In an exemplary implementation, the pixel drive circuit may have a structure of 3T1C, 4T1C, 5T1C, 5T2C, 6T1C or 7T1C. FIG. 3 illustrates a schematic diagram of an equivalent circuit of a pixel drive circuit. As shown in FIG. 3, the pixel drive circuit may include seven transistors (a first transistor T1 to a seventh transistor T7), one storage capacitor C and seven signal wires (a data signal wire D, a first scanning signal wire S1, a second scanning signal wire S2, a light emitting signal wire E, an initial signal wire INIT, a first power supply line VDD and a second power supply line VSS).

In an exemplary embodiment, a first end of the storage capacitor C is connected with the first power supply line VDD, and a second end of the storage capacitor C is connected with a second node N2, that is, the second end of the storage capacitor C is connected with a control electrode of the third transistor T3.

A control electrode of the first transistor T1 is connected with the second scanning signal wire S2, a first electrode of the first transistor T1 is connected with the initial signal wire INIT, and a second electrode of the first transistor is connected with a second node N2. When an ON-level scanning signal is applied to the second scanning signal wire S2, the first transistor T1 transmits initialization voltage to the control electrode of the third transistor T3 to initialize the charge amount of the control electrode of the third transistor T3.

A control electrode of the second transistor T2 is connected with the first scanning signal wire S1, a first electrode of the second transistor T2 is connected with the second node N2, and a second electrode of the second transistor T2 is connected with a third node N3. When an ON-leveling signal is applied to the first scanning signal wire S1, the second transistor T2 connects the control electrode and second electrode of the third transistor T3.

The control electrode of the third transistor T3 is connected with the second node N2, that is, the control electrode of the third transistor T3 is connected with the second end of the storage capacitor C, a first electrode of the third transistor T3 is connected with a first node N1, and a second electrode of the third transistor T3 is connected with the third node N3. The third transistor T3 may be called a drive transistor, and the third transistor T3 determines the amount of drive current flowing between the first power supply line VDD and the second power supply line VSS according to the potential difference between its control electrode and first electrode.

A control electrode of the fourth transistor T4 is connected with the first scanning signal wire S1, a first electrode of the fourth transistor T4 is connected with the data signal wire D, and a second electrode of the fourth transistor T4 is connected with the first node N1. The fourth transistor T4 may be called a switch transistor, a scan transistor, etc. When the on level scanning signal is applied to the first scanning signal wire S1, the fourth transistor T4 inputs a data voltage of the data signal wire D to the pixel drive circuit.

A control electrode of the fifth transistor T5 is connected with the light emitting signal wire E, a first electrode of the fifth transistor T5 is connected with the first power supply line VDD, and a second electrode of the fifth transistor T5 is connected with the first node N1. A control electrode of the sixth transistor T6 is connected with the light emitting signal wire E, a first electrode of the sixth transistor T6 is connected with the third node N3, and a second electrode of the sixth transistor T6 is connected with the first electrode of the light emitting device. The fifth transistor T5 and the sixth transistor T6 may be called light emitting transistors. When an ON-level light emitting signal is applied to the light emitting signal wire E, the fifth transistor T5 and the sixth transistor T6 make the light emitting element to emit light by forming a drive current path between the first power supply line VDD and the second power supply line VSS.

A control electrode of the seventh transistor T7 is connected with the first scanning signal wire S1, a first electrode of the seventh transistor T7 is connected with the initial signal wire INIT, and a second electrode of the seventh transistor T7 is connected with a first electrode of the light emitting device. When an ON-level scanning signal is applied to the first scanning signal wire S1, the seventh transistor T7 transmits an initialization voltage to the first electrode of the light emitting device to initialize or release an amount of charge accumulated in the first electrode of the light emitting device.

In an exemplary embodiment, a second electrode of the light emitting device is connected to the second power line VSS, a signal of the second power line VSS is a low level signal and a signal of the first power line VDD continuously provides a high-level signal. The first scanning signal wire S1 is a scanning signal wire for a pixel drive circuit of a current display row, and the second scanning signal wire S2 is a scanning signal wire for a pixel drive circuit of a previous display row. That is, for an nth display row, the first scanning signal wire S1 is S(n), the second scanning signal wire S2 is S(n−1), the second scanning signal wire S2 of the current display row and the first scanning signal wire S1 for the pixel drive circuit of the previous display row are the same signal wire, which may reduce the signal wires of the display panel and realize the narrow frame of the display panel.

In an exemplary embodiment, the first transistor T1 to the seventh transistor T7 may be P-type transistors or N-type transistors. Using the same type of transistors in the pixel drive circuit can simplify the process flow, reduce the process difficulty of the display panel, and improve the yield of the product. In some possible implementations, the first transistor T1 to the seventh transistor T7 may include P-type transistors and N-type transistors.

In an exemplary embodiment, a first scanning signal wire S1, a second scanning signal wire S2, a light emitting signal wire E, a initial signal wire INIT extend along a horizontal direction, and a second power supply line VSS, a first power supply line VDD and a data signal wire D extend along a vertical direction.

In an exemplary embodiment, the light emitting device may be an Organic Light Emitting Diode (OLED), including a first electrode (anode), an organic emitting layer, and a second electrode (cathode) which are stacked.

Figure 4:
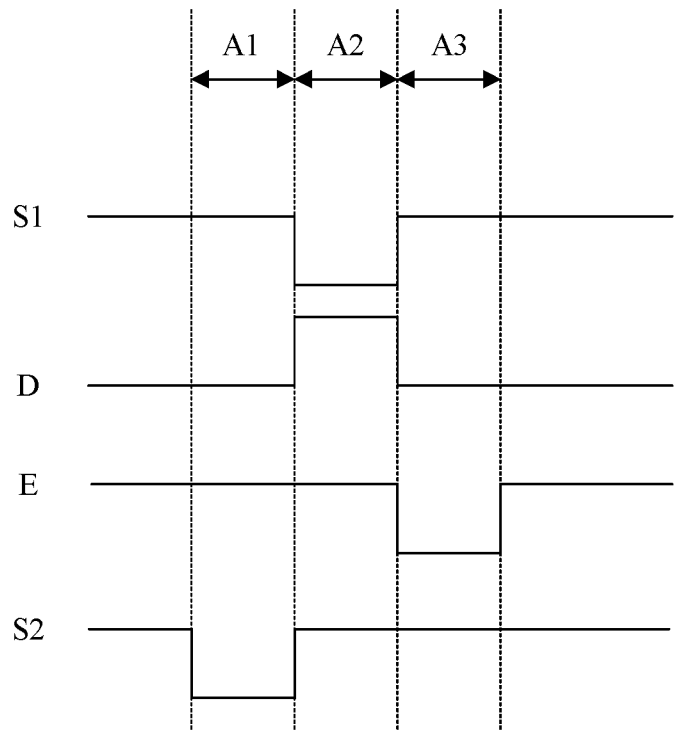
FIG. 4 is a sequence chart of a pixel drive circuit.

FIG. 4 illustrates a working timing sequence diagram of a pixel drive circuit. The exemplary embodiment of the present disclosure will be described below through the working process of the pixel drive circuit illustrated in FIG. 3. A pixel drive circuit in FIG. 3 includes seven transistors (a first transistor T1 to a seventh transistor T7), one storage capacitor C and seven signal wires (a data signal wire D, a first scanning signal wire S1, a second scanning signal wire S2, a light emitting signal wire E, an initial signal wire INIT, a first power supply line VDD and a second power supply line VSS). The seven transistors are all P-type transistors.

In an exemplary embodiment, the working process of the pixel drive circuit may include the following stages.

In a first stage A1, which is called a reset stage, a signal of the second scanning signal wire S2 is a low-level signal, and signals of the first scanning signal wire S1 and the light emitting signal wire E are high-level signals. The signal of the second scanning signal wire S2 is a low-level signal, so that the first transistor T1 is ON, and a signal of the initial signal wire INIT is provided to the second node N2 to initialize the storage capacitor C to clear the original data voltage in the storage capacitor. The signals of the first scanning signal wire S1 and the light emitting signal wire E are high-level signals, so that the second transistor T2, the fourth transistor T4, the fifth transistor T5, the sixth transistor T6 and the seventh transistor T7 are OFF. The OLED does not emit light in this stage.

In a second stage A2, called a data write stage or a threshold compensation stage, the signal of the first scanning signal wire S1 is a low-level signal, the signals of the second scanning signal wire S2 and the light emitting signal wire E are high-level signals, and the data signal wire D outputs a data voltage. In this stage, since the second end of the storage capacitor C is at a low level, the third transistor T3 is ON. The signal of the first scanning signal wire S1 is a low-level signal, so that the second transistor T2, the fourth transistor T4 and the seventh transistor T7 are ON. The second transistor T2 and the fourth transistor T4 are ON, so that the data voltage output by the data signal wire D is provided to the second node N2 through the first node N1, the ON third transistor T3, the third node N3 and the ON second transistor T2, a difference between the data voltage output by the data signal wire D and the threshold voltage of the third transistor T3 is charged into the storage capacitor C, the voltage of the second end (the second node N2) of the storage capacitor C is Vd−|Vth|, Vd is the data voltage output by the data signal wire D, and Vth is the threshold voltage of the third transistor T3. The seventh transistor T7 is ON, so that the initial voltage of the initial signal wire INIT is provided to the first electrode of the OLED to initialize (resets) the first electrode of the OLED to clear its internal pre-stored voltage to complete the initialization, thus ensuring that the OLED does not emit light. The signals of the second scanning signal wire S2 are high-level signals, so that the first transistor T1 is turned off. The signal of the light emitting signal wire E is a high-level signal, so that the fifth transistor T5 and the sixth transistor T6 are turned off.

In a third stage A3, called a light emitting stage, the signal of the light emitting signal wire E is a low-level signal, and the signals of the first scanning signal wire S1 and the second scanning signal wire S2 are high-level signals. The signal of the light emitting signal wire E is a low-level signal, so that the fifth transistor T5 and the sixth transistor T6 are ON, and the power supply voltage output by the first power supply line VDD is provided as drive voltage to the first electrode of the OLED through the ON fifth transistor T5, third transistor T3 and sixth transistor T6 to drive the OLED to emit light.

In a driving process of the pixel drive circuit, the driving current flowing through the third transistor T3 (driving transistor) is determined by a voltage difference between the gate electrode and first electrode thereof. Since the voltage of the second node N2 is Vdata−|Vth|, the driving current of the third transistor T3 is:

$$I=K*(Vgs-Vth)2=K*[(Vdd-Vd+|Vth|)-Vth]2=K*[Vdd-Vd]2.$$

I is the drive current flowing through the third transistor T3, that is, the drive current driving the OLED, K is a constant, VGS is the voltage difference between the gate electrode and the first electrode of the third transistor T3, Vth is the threshold voltage of the third transistor T3, Vd is the data voltage output by the data signal wire D, and Vdd is the power supply voltage output by the first power supply line VDD.

Figure 5:
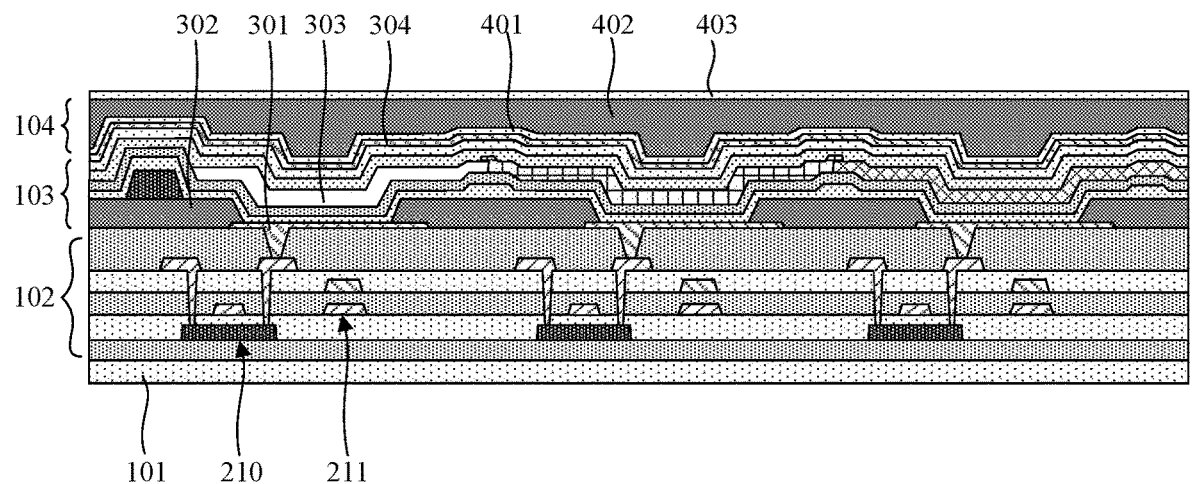
FIG. 5 is a schematic diagram of a sectional structure of a display substrate.

FIG. 5 is a schematic sectional view of a display substrate, showing a structure of three sub-pixels in an OLED display substrate. Referring to FIG. 5, on a plane perpendicular to the display substrate, the display substrate may include a drive circuit layer 102 disposed on a substrate 101, a light emitting structure layer 103 disposed on a side of the drive circuit layer 102 away from the substrate 101, and an encapsulation layer 104 disposed on a side of the light emitting structure layer 103 away from the substrate 101. In some possible embodiments, the display substrate may include other film layers, such as post spacers, which is not limited in the present disclosure.

In an exemplary implementation, the substrate may be a flexible substrate or may be a rigid substrate. The flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si), polycrystalline silicon (p-si) or oxide.

In an exemplary embodiment, the drive circuit layer 102 of each sub-pixel may include a plurality of transistors and a storage capacitor constituting a pixel drive circuit, an example of which is illustrated in FIG. 5 where only one drive transistor and one storage capacitor are taken as an example for illustration. In some possible implementations, the drive circuit layer 102 of each sub-pixel may include: a first insulating layer disposed on the substrate; an active layer disposed on the first insulating layer; and a second insulating layer covering the active layer; a gate electrode and a first capacitor electrode disposed on the second insulating layer; a third insulating layer covering the gate electrode and the first capacitor electrode; a second capacitor electrode disposed on the third insulating layer; a fourth insulating layer covering the second capacitor electrode, via holes formed on the second insulating layer, the third insulating layer, and the fourth insulating layer which expose the active layer; a source electrode and a drain electrode disposed on the fourth insulating layer, which are respectively connected to the active layer through via holes; a planarization layer covering the aforementioned structure wherein the planarization layer is provided with via holes, and the via holes expose the drain electrode. The active layer, the gate electrode, the source electrode and the drain electrode form a transistor 210, and the first capacitor electrode and the second capacitor electrode form a storage capacitor 211.

In an exemplary embodiment, the light emitting structure layer 103 includes a light emitting device that makes an organic material emit light under the action of an electric field, and the light emitting structure layer 103 may include an anode 301, a pixel define layer 302, an organic emitting layer 303, and a cathode 304. The anode 301 is disposed on the planarization layer 205, and is connected to the drain electrode of the drive transistor 210 through a via hole disposed on the planarization layer 205; the pixel define layer 302 is disposed on the anode 301 and the planarization layer 205, and the pixel define layer 302 is provided with a pixel opening exposing the anode 301; the organic emitting layer 303 is at least partially disposed in the pixel opening, and is connected to the anode 301; the cathode 304 is disposed on the organic emitting layer 303, and is connected to the organic emitting layer 303; and the organic emitting layer 303 emits light of corresponding colors under the drive of the anode 301 and the cathode 304.

In an exemplary embodiment, an encapsulation layer 104 may include a first encapsulation layer 401, a second encapsulation layer 402 and a third encapsulation layer 403 that are stacked; the first encapsulation layer 401 and the third encapsulation layer 403 may be made of an inorganic material, and the second encapsulation layer 402 may be made of an organic material; the second encapsulation layer 402 is disposed between the first encapsulation layer 401 and the third encapsulation layer 403 to ensure that external vapor may not enter into the light emitting structure layer 103.

In an exemplary embodiment, the organic emitting layer of the OLED emitting device may include an Emitting Layer (EML), and one or more film layers selected from a Hole Injection Layer (HIL), a Hole Transport Layer (HTL), a Hole Block Layer (HBL), an Electron Block Layer (EBL), an Electron Injection Layer (EIL) and an Electron Transport Layer (ETL). Under the drive of the voltage of the anode and the cathode, light is emitted according to actual needs by using the light emitting property of the organic material.

In an exemplary embodiment, the emitting layers of OLED emitting devices of different colors are different. For example, a red light emitting device includes a red emitting layer, a green light emitting device includes a green emitting layer, and a blue light emitting device includes a blue emitting layer. In order to reduce the difficulty of the process and improve the yield, the hole injection layer and hole transport layer on one side of the emitting layer may adopt a common connected layer, and the electron injection layer and the electron transport layer on the other side of the emitting layer may adopt a common connected layer. In an exemplary embodiment, any one or more layers of the hole injection layer, the hole transport layer, the electron injection layer and the electron transport layer may be manufactured by one-time process (one-time evaporation process or one-time ink-jet printing process), but the isolation is realized by means of the height difference of formed film layer or by means of the surface treatment. For example, any one or more of the hole injection layers, hole transport layers, electron injection layers and electron transport layers corresponding to adjacent sub-pixels may be isolated. In an exemplary embodiment, an organic emitting layer may be prepared and formed by an evaporation process or an inkjet process.

With the market demands for higher resolution of products, higher brightness of independent sub-pixels and lower power consumption of products, higher requirements are attached to the efficiency, brightness, voltage and service life of devices. In an OLED structure, a blue light emitting device and a green light emitting device has a short service life, which leads to white balance color drift after long-term use, and visually, phenomena such as turning red, green and pink may show up when a white screen is on.

A research shows that the service life attenuation of monochromatic light emitting devices in OLED is mainly caused by interface degradations and material defects. The main reason for interface deterioration is that the energy barrier at the interface is too large and the accumulated charges are too many. For example, interfaces on both sides of the emitting layer are key interfaces where holes and electrons are injected into the emitting layer, and the energy level matching between the two interfaces may easily lead to carrier accumulation, and the charge accumulation may easily lead to an interface deterioration and accelerate life service decay of devices. The main reason for material defects is the distortion of the bond or the fracture of the bond. For example, the more easily deteriorated material in OLED is the material of the electron block layer. Since the exciton recombination region of the emitting layer is mainly concentrated at the 0% of interface between the electron block layer and the emitting layer, too many electrons accumulate at the interface. Generally, a material of an electron block layer is an electron-abundance system material and contains aniline structure. Excessive accumulated electrons will have a repulsive force with abundance electrons of the electron block layer, which will cause a distortion of the δ bond of benzene rings on aniline, and a result of the distortion of the δ bond caused by the external force is bond fracture, leading to material defects and rapid service life decay of devices.

Figure 6:
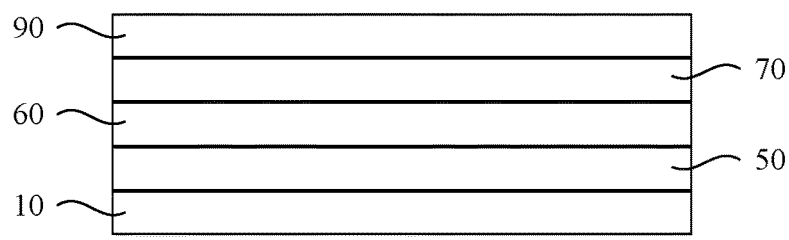
FIG. 6 is a schematic diagram of a structure of an light emitting device according to an exemplary embodiment of the present disclosure.

FIG. 6 is a schematic diagram of a structure of a light emitting device according to an exemplary embodiment of the present disclosure. As shown in FIG. 6, a light emitting device may include an anode 10, a cathode 90, and an organic emitting layer disposed between the anode 10 and the cathode 90. In an exemplary embodiment, an organic emitting layer may include an Emitting Layer (EML) 50, a Hole Block Layer (HBL) 60, and an Electron Transport Layer (ETL) 70 which are stacked. The hole block layer 60 and the electron transport layer 70 are disposed between the cathode 90 and the emitting layer 50, the hole block layer 60 is disposed on a side of the emitting layer 50 close to the cathode 90, and the electron transport layer 70 is disposed on a side of the cathode 90 close to the emitting layer 50. That is, the hole block layer 60 is disposed between the emitting layer 50 and the electron transport layer 70, and the electron transport layer 70 is disposed between the hole block layer 60 and the cathode 90. In an exemplary embodiment, a hole block layer 60 is configured to form a migration barrier for holes and prevent holes from migrating out of the emitting layer 50. An electron transport layer 70 is configured to achieve directional and orderly controllable migration of injected electrons, and an emitting layer 50 is configured to recombine electrons and holes to emit light.

In an exemplary embodiment, a hole block layer and an electron transport layer satisfy:

$$EETL/EHBL > 1;$$

where EETL is the electromigration rate of the electron transport layer, and EHBL is the electromigration rate of the hole block layer.

In an exemplary embodiment, by configuring the electromigration rate EHBL of the hole block layer to be smaller than the electromigration rate EETL of the electron transport layer, the electromigration rate of the electron transport layer can be used to control the electron injection density.

In an exemplary embodiment, the electromigration rate EETL of the electron transport layer may be about $10^{-7}$ cm²/Vs to $10^{-5}$ cm²/Vs@$5000V^{1/2}/m^{1/2}$.

In an exemplary embodiment, the electromigration rate EHBL of the hole block layer may be about $10^{-8}$ cm²/Vs to $10^{-7}$ cm²/Vs@$5000V^{1/2}/m^{1/2}$.

In an exemplary embodiment, an electromigration rate may be tested using the Space Charge Limited Current (SCLC) method, and @$5000V^{1/2}/m^{1/2}$ refers to the electromigration rate under this electric field.

In an exemplary embodiment, a hole block layer and an electron transport layer satisfy:

$$|HOMOETL - HOMOHBL| \geq 0.1 \text{ Ev}.$$

Wherein, HOMOETL is a Highest Occupied Molecular Orbital (HOMO) energy level of the electron transport layer and HOMOHBL is a HOMO energy level of the hole block layer.

In an exemplary embodiment, configuring an HOMO energy level relationship between the hole block layer and the electron transport layer can enable the electron transport layer to simultaneously block holes, which can prevent the hole block layer from being too thin and prevent the holes passing through the hole block layer from cause electron quenching.

In an exemplary embodiment, a hole block layer and an electron transport layer satisfy:

|LUMOETL−LUMOHBL|≥0.2 eV.

Wherein, LUMOETL is the Lowest Unoccupied Molecular Orbital (LUMO) energy level of the electron transport layer, and LUMOHBL is the LUMO energy level of the hole block layer.

In an exemplary embodiment, a relationship between the LUMO energy level between the hole block layer and the electron transport layer can control electrons in the electron transport layer, slow down the transport of electrons to the emitting layer, and regulate the recombination region away from the interface between the emitting layer and the electron block layer.

In an exemplary embodiment, a HOMO energy level of the hole block layer may be about 6.1 eV to 6.5 eV, and a HOMO energy level of the electron transport layer may be about 6.0 eV to 6.4 eV.

In an exemplary embodiment, a LUMO energy level of the hole block layer may be about 2.5 eV to 2.9 eV, and the LUMO energy level of the electron transport layer may be about 2.7 eV to 3.1 eV.

In an exemplary embodiment, the HOMO energy level and LUMO energy level may be measured by means of a photoelectron spectrophotometer (AC3/AC2) or ultraviolet (UV) spectroscopy.

In an exemplary embodiment, a thickness of a hole block layer may be about 5 nm to 15 nm.

In an exemplary embodiment, a thickness of the electron transport layer may be about 20 nm to 50 nm.

In an exemplary embodiment, an emitting layer may be a red emitting layer, a green emitting layer, or a blue emitting layer. An overall performance of a light emitting device may be better improved by increasing luminance efficiency and a service life of the red emitting layer, green emitting layer and blue emitting layer.

In an exemplary embodiment, a material of the hole block layer includes, but is not limited to, a compound having a structure of Formula 1.

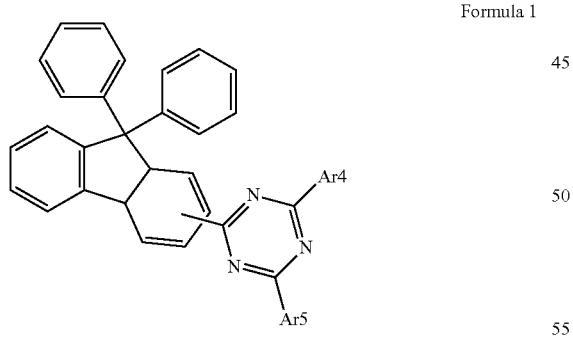

Formula 1

Wherein, Ar4 to Ar5 are independently substituted or unsubstituted aryl groups having 6 to 30 ring carbon atoms, or substituted or unsubstituted heteroaryl groups having 5 to 20 ring atoms.

In an exemplary embodiment, a compound of the structure shown in Formula 1 contains a dimethyl fluorene unit, which helps to increase the crystallization stability of the material, and the degree of crystallinity is small.

In an exemplary embodiment, a hole block layer may include one or more of compounds having the following structural formula.

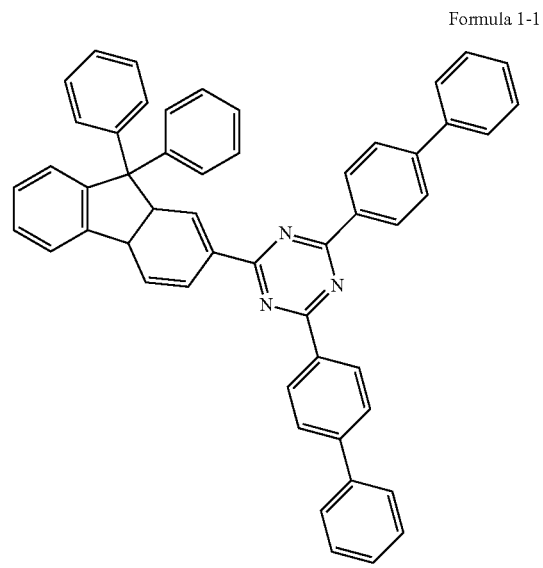

Formula 1-1

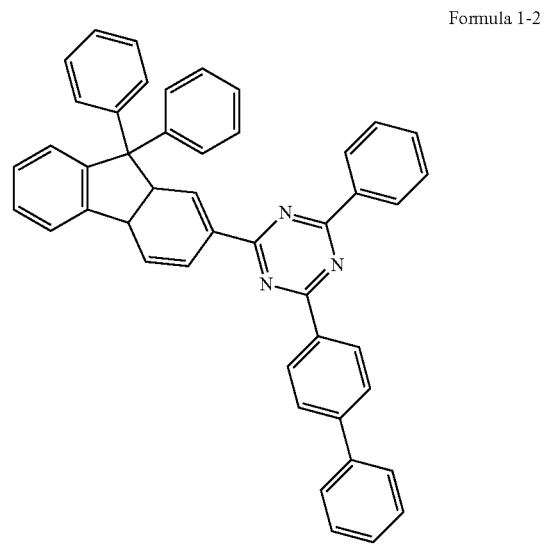

Formula 1-2

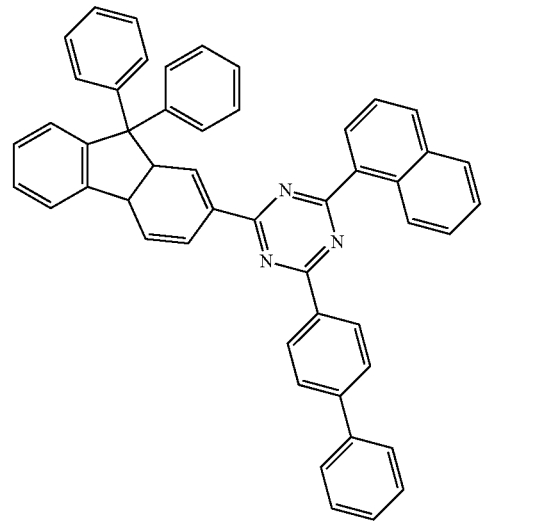

Formula 1-3

Formula 1-4

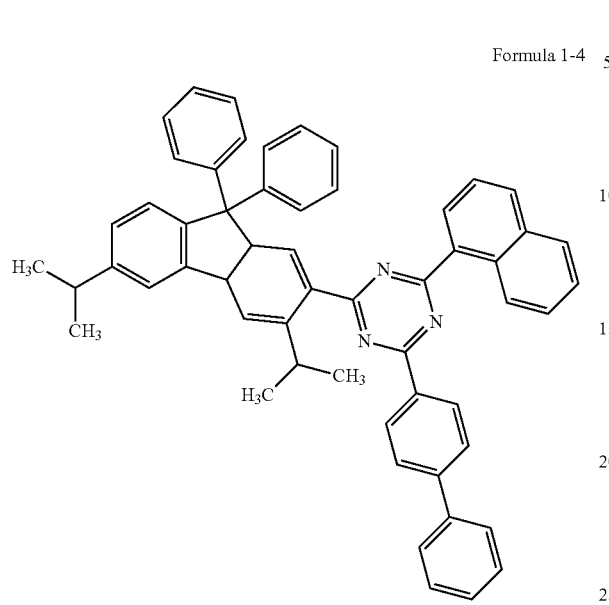

Formula 1-6

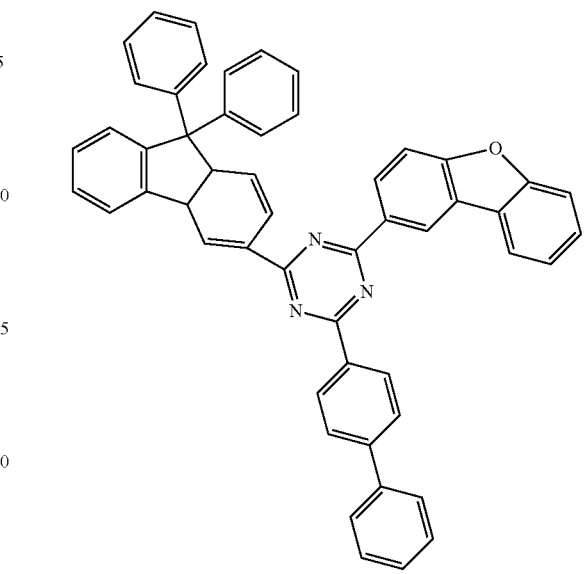

Formula 1-5

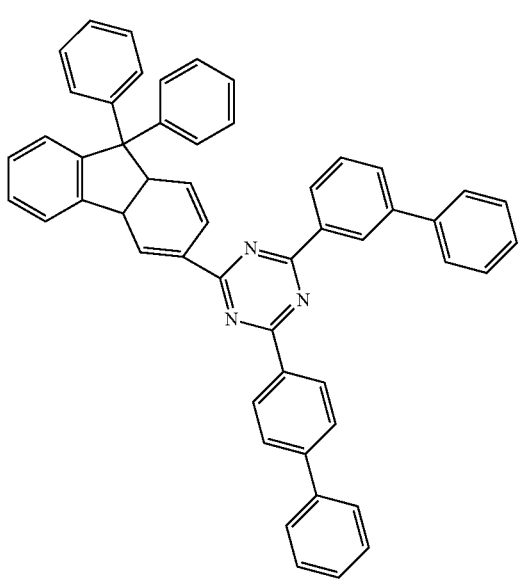

In an OLED structure, an exciton recombination region is mainly concentrated at an interface between the emitting layer and the electron block layer (interface between EBL/EML), which makes excessive electrons accumulate at the interface. The accumulated electrons will lead to a material cracking of the electron block layer, thus reducing stability and a service life of the material. According to the exemplary embodiments of the present disclosure, reasonably matching the mobility relationship, energy level relationship, or energy level and mobility relationship between the hole block layer and the electron transport layer can not only control the density of electrons injected into the emitting layer, but also slow down the transmission of electrons to the emitting layer, so that the recombination region can be far away from the EBL/EML interface, which reduces the damage of the electron block layer. Therefore, the material stability of the electron block layer is improved, the material deterioration and performance degradation caused by electron accumulation are reduced, the life of the device is increased, and holes can be effectively blocked from passing through the hole block layer and the electron transport layer, and electron quenching is avoided, improving the luminance efficiency. The exemplary embodiments of the present disclosure increase the stability and service life of the device by adopting the electron transport layer material with a small degree of crystallinity.

Figure 7:
FIG. 7 is a schematic diagram of a structure of another light emitting device according to an exemplary embodiment of the present disclosure.

FIG. 7 is a schematic diagram of a structure of another light emitting device according to an exemplary embodiment of the present disclosure. As shown in FIG. 7, an light emitting device may include an anode 10, a cathode 90, and an organic emitting layer disposed between the anode 10 and the cathode 90. In an exemplary embodiment, the organic emitting layer may include a hole injection layer 20, a hole transport layer 30, an electron block layer 40, an emitting layer 50, a hole block layer 60, an electron transport layer 70, and an electron injection layer 80 which are stacked. The hole injection layer 20, the hole transport layer 30 and the electron block layer 40 are disposed between the anode 10 and the emitting layer 50; the hole injection layer 20 is connected to the anode 10, and the electron block layer 40 is connected to the emitting layer 50; the hole transport layer 30 is disposed between the hole injection layer 20 and the electron block layer 40. The hole block layer 60, the electron transport layer 70 and the electron injection layer 80 are disposed between the emitting layer 50 and the cathode 90; the hole block layer 60 is connected to the emitting layer 50; the electron injection layer 80 is connected to the cathode 90; and the electron transport layer 70 is disposed between the hole block layer 60 and the electron injection layer 80. In an exemplary embodiment, the hole injection layer 20 is configured to lower a barrier for injecting holes from the anode, so that the holes may be efficiently injected into the emitting layer 50 from the anode. The hole transport layer 30 is configured to achieve directional and orderly controllable migration of injected holes. The electron block layer 40 is configured to form a migration barrier for electrons and prevent electrons from migrating out of the emitting layer 50. The emitting layer 50 is configured to recombine electrons and holes to emit light. The hole block layer 60 is configured to form a migration barrier for holes and prevent holes from migrating out of the emitting layer 50. The electron transport layer 70 is configured to achieve directional and orderly controllable migration of injected electrons. The electron injection layer 80 is configured to lower barriers of electrons injected from the cathode, so that the electrons may be efficiently injected into the emitting layer 50 from the cathode.

In an exemplary embodiment, the material and structure of an electron transport layer 70 are the same as or similar to those of the foregoing embodiment, which will not be repeated here.

In an exemplary embodiment, the anode may be made of a material having a high work function. For a bottom emission type, the anode may be made of a transparent oxide material, such as indium tin oxide (ITO) or indium zinc oxide (IZO), and the thickness of the anode may be about 80 nm to 200 nm. For the top emitting type, the anode may be made of a composite structure of metal and transparent oxide, such as Ag/ITO, Ag/IZO or ITO/Ag/ITO. The thickness of the metal layer in the anode may be about 80 nm to 100 nm, and the thickness of the transparent oxide in the anode may be about 5 nm to 20 nm, so that the average reflectivity of the anode in the visible region is about 85%-95%.

In an exemplary embodiment, for a top emitting type OLED, the cathode may be made of a metal material and formed by adopting an evaporation process, the metal material may be magnesium (Mg), silver (Ag) or aluminum (Al), or an alloy material, such as Mg:Ag alloy, the Mg:Ag ratio is about 9:1 to 1:9, and the thickness of the cathode may be about 10 nm to 20 nm, so that the average transmittance of the cathode at the wavelength of 530 nm is about 50%-60%. For a bottom emission type OLED, the cathode may be made of magnesium (Mg), silver (Ag), aluminum (Al) or Mg:Ag alloy, and the thickness of the cathode may be greater than 80 nm, so that the cathode has good reflectivity.

In an exemplary embodiment, the hole injection layer may be made of an inorganic oxide, such as molybdenum oxide, titanium oxide, vanadium oxide, rhenium oxide, ruthenium oxide, chromium oxide, zirconium oxide, hafnium oxide, tantalum oxide, silver oxide, tungsten oxide or manganese oxide, etc., or may be made of a p-type dopant of a strong electron absorption system and a dopant of a hole transport material, such as hexacyanohexaazatriphenylene, 2,3,5,6-tetrafluoro-7,7',8,8'-tetracyano-p-quinone dimethyl (F4-TCNQ), or 1,2,3-tri[(cyano) (4-cyano-2,3,5,6-tetrafluorophenyl) methylene] cyclopropane, etc.

In an exemplary embodiment, a thickness of the hole injection layer may be about 5 nm to 20 nm.

In an exemplary embodiment, a hole transport layer and an electron block layer may adopt aromatic amines or carbazole materials with hole transport characteristics, such as 4,4'-bis [N-(1-naphthyl)-N-phenylamino] biphenyl (NPB), N,N'-bis(3-methylphenyl)-N,N'-diphenyl-1,1'-biphenyl-4,4'-diamine (TPD), 4-phenyl-4'-(9-phenylfluorene-9-yl) triphenylamine (BAFLP), 4,4'-bis[N-(9,9-dimethylfluoren-2-yl)-N-phenylamino] biphenyl (DFLDPBi), 4,4'-bis(9-carbazolyl)biphenyl (CBP) or 9-phenyl-3-[4-(10-phenyl-9-anthryl)phenyl]-9H-carbazole (PCzPA), etc.

In an exemplary embodiment, a thickness of the hole transport layer may be about 60 nm to 150 nm, and a thickness of the electron block layer may be about 5 nm to 20 nm.

In an exemplary embodiment, the emitting layer material may include one type of material, or may include two or more mixed materials. Emitting materials are classified into a blue emitting material, a green emitting material and a red emitting material. The blue emitting material may be selected from pyrene derivatives, anthracene derivatives, fluorene derivatives, perylene derivatives, styrylamine derivatives, metal complexes, etc. For example, N1,N6-bis ([1,1'-biphenyl]-2-yl)-N1,N6-bis([1,1'-biphenyl]-4-yl) pyrene-1,6-bis diamine, 9,10-bis-(2-naphthyl)anthracene (ADN), 2-methyl-9,10-di-2-naphthylanthracene (MADN), 2,5,8,11-tetra-tert-butyl perylene (TBPe), 4,4'-bis[4-(diphenylamino)styryl]biphenyl (BDAV Bi), 4,4'-bis[4-(di-p-tolylamino)styryl] biphenyl (DPAVBi), bis(4,6-difluorophenylpyridine-C2,N) picolinoyl iridium (Flrpic).

The green emitting material may be selected from, for example, coumarin dyes, copper quinacridinium derivatives, polycyclic aromatic hydrocarbons, diamine anthracene derivatives, carbazole derivatives, or metal complexes. For example, coumarin 6 (C-6), coumarin 545T (C-525T), quinacridine copper (QA), N,N'-dimethyl quinacridone (DMQA), 5,12-diphenyl naphthalene (DPT), N10,N10'-diphenyl-N10,N10'-dinaphthalenyl-9,9'-bianthracene-10,10'-diamine (abbreviated as BA-NPB), tris (8-hydroxyquinoline) aluminum (III) (abbreviated as Alq3), tris (2-phenylpyridine) iridium (Ir(ppy)3), acetylacetonate bis (2-phenylpyridine) iridium (Ir(ppy)2(acac)). The red emitting material may be selected from DCM series materials or metal complexes. For example, 4-(dicyanomethylene)-2-methyl-6-(4-dimethylaminostyryl)-4H-pyran (DCM), 4-(dicyanomethylene)-2-tert-butyl-6-(1,1,7,7-tetramethyljulonidine-9-enyl)-4H-pyran (DCJTB), bis(1-phenylisoquinoline) (Acetylacetone) iridium(III) (Ir(piq)2(acac)), platinum octaethylporphyrin (PtOEP), bis(2-(2'-benzothienyl)pyridine-N, C3') (Acetylacetone) iridium (abbreviated as Ir(btp)2 (acac), etc.

In an exemplary embodiment, an emitting layer containing two or more mixed materials may include a host material and a dopant material, and the doping ratio of the dopant material is 1% to 20%. Within the doping ratio range, the host material can effectively transfer the exciton energy to the dopant material to excite the dopant material to emit light; the host material "dilutes" the dopant material, which can effectively improve the fluorescence quenching caused by the collision between molecules and energy of the dopant material, and the luminance efficiency and device life are improved.

In an exemplary embodiment of the present disclosure, a doping ratio refers to a ratio of mass of the dopant material to mass of the emitting layer, that is, mass percentage. In an exemplary embodiment, the host material and the dopant material are co-evaporated through a multi-source evaporation process, so that the host material and the dopant material are uniformly dispersed in the emitting layer. A doping ratio may be adjusted by controlling an evaporation rate of the dopant material or by controlling an evaporation rate ratio of the host material to the dopant material during an evaporation process.

In an exemplary embodiment, a thickness of an emitting layer 50 is about 10 nm to 25 nm.

In an exemplary embodiment, the hole block layer may use aromatic heterocyclic compounds, such as imidazole derivatives like benzimidazole derivatives, imidazopyridine derivatives, and benzimidazophenanthridine derivatives; oxazine derivatives like pyrimidine derivatives and triazine derivatives; compounds having a nitrogen-containing six-membered ring structure (also including compounds having a phosphine oxide-based substituent on the heterocyclic ring) such as quinoline derivatives, isoquinoline derivatives, phenanthroline derivatives, etc. For example, 2-(4-biphenyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenyl)-1,2,4-Triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP) or 4,4'-bis(5-methylbenzoxazol-2-yl)stilbene (BzOs), etc.

In an exemplary embodiment, the electron injection layer may use alkali metals or metals such as lithium fluoride (LiF), ytterbium (Yb), magnesium (Mg) or Calcium (ca), or compounds of these alkali metals or metals.

In an exemplary embodiment, a thickness of the electron injection layer may be about 0.5 nm to 2 nm.

In an exemplary embodiment, for a top emitting OLED, a thickness of an organic emitting layer between the cathode and the anode may be designed to meet optical path requirements of the optical microresonator, so as to obtain an optimal intensity and a color of an emitted light.

In an exemplary embodiment, a display substrate may include an encapsulation layer, which may be encapsulated by a cover plate, or a thin film.

In an exemplary embodiment, the following preparation method may be used to prepare a display substrate including an OLED.

First, a drive circuit layer is formed on a substrate by using a patterning process. The drive circuit layer of each sub-pixel may include a drive transistor and a storage capacitor which form the pixel drive circuit.

Then, a planarization layer is formed on the substrate on which the above structure is formed. A via exposing a drain electrode of the drive transistor is formed in the planarization layer of each sub-pixel.

Then, an anode is formed by using a patterning process on the substrate on which the above structure is formed. The anode of each sub-pixel is connected with the drain electrode of the drive transistor through the via hole in the planarization layer.

After that, a pixel definition layer is formed through a patterning process on the substrate on which the above structure is formed. A pixel opening exposing the anode is formed in the pixel definition layer of each sub-pixel. Each pixel opening is used as a light emitting region of each sub-pixel.

Then, a hole injection layer and a hole transport layer are evaporated subsequently by using an Open Mask on the substrate on which the above structure is formed, and a common connected layer of the hole injection layer and the hole transport layer is formed on the display substrate, that is, the hole injection layers of all sub-pixels are connected, and the hole transport layers of all sub-pixels are connected. For example, the respective areas of the hole injection layer and the hole transport layer are approximately the same and the thicknesses are different.

After that, an electronic block layer and a red emitting layer, an electronic block layer and a green emitting layer, and an electronic block layer and a blue emitting layer are respectively evaporated on different sub-pixels by using a Fine Metal Mask (FMM). The electronic block layers and the emitting layers of adjacent sub-pixels may overlap slightly (for example, the overlap part accounts for less than 10% of the area of the respective emitting layer pattern), or may be isolated.

Then, a hole block layer, an electron transport layer, an electron injection layer and a cathode are evaporated subsequently by using an open mask, and a common connected layer of the hole block layer, the electron transport layer, the electron injection layer and the cathode is formed on the display substrate, that is, the hole block layers of all sub-pixels are connected, the electron transport layers of all sub-pixels are connected, the electron injection layers of all sub-pixels are connected, and the cathodes of all sub-pixels are connected.

In an exemplary embodiment, a multi-source co-evaporation method may be adopted in an evaporated emitting layer to form an emitting layer containing a host material and a dopant material. A doping ratio may be adjusted by controlling an evaporation rate of the dopant material or by controlling an evaporation rate ratio of the host material to the dopant material during an evaporation process.

In an exemplary embodiment, orthographic projections of one or more of the hole injection layer, the hole transport layer, the hole block layer, the electron transport layer, the electron injection layer, and the cathode on the substrate is continuous. In some examples, at least one of the hole injection layers, the hole transport layers, the hole block layers, the electron transport layers, the electron injection layers and the cathodes in at least one row or column of sub-pixels is connected. In some examples, at least one of the hole injection layers, the hole transport layers, the hole block layers, the electron transport layers, the electron injection layers and the cathodes of a plurality of sub-pixels are connected.

In an exemplary embodiment, the organic emitting layer may include a microcavity adjusting layer located between the hole transport layer and the emitting layer. For example, after the hole transport layer is formed, a red microcavity adjustment layer and a red emitting layer, a green microcavity adjustment layer and a green emitting layer, and a blue microcavity adjustment layer and a blue emitting layer may be respectively evaporated on different sub-pixels by using a fine metal mask. In some exemplary embodiments, the red microcavity adjustment layer, the green microcavity adjustment layer and the blue microcavity adjustment layer may include an electron block layer.

In an exemplary embodiment, since the hole block layer is a common layer and an emitting layers of different sub-pixels are isolated, an orthographic projection of the hole block layer on the substrate includes an orthographic projection of the emitting layer on the substrate, and an area of the hole block layer is larger than that of the emitting layer.

In an exemplary embodiment, since the hole block layer is a common layer, an orthographic projection of the hole block layer on the substrate at least includes orthographic projections of emitting regions of two sub-pixels on substrate.

In an exemplary embodiment, an orthographic projection of at least part of emitting layers of sub-pixels on substrate overlaps an orthographic projection of a drive transistor of a pixel drive circuit on substrate.

Figure 8:
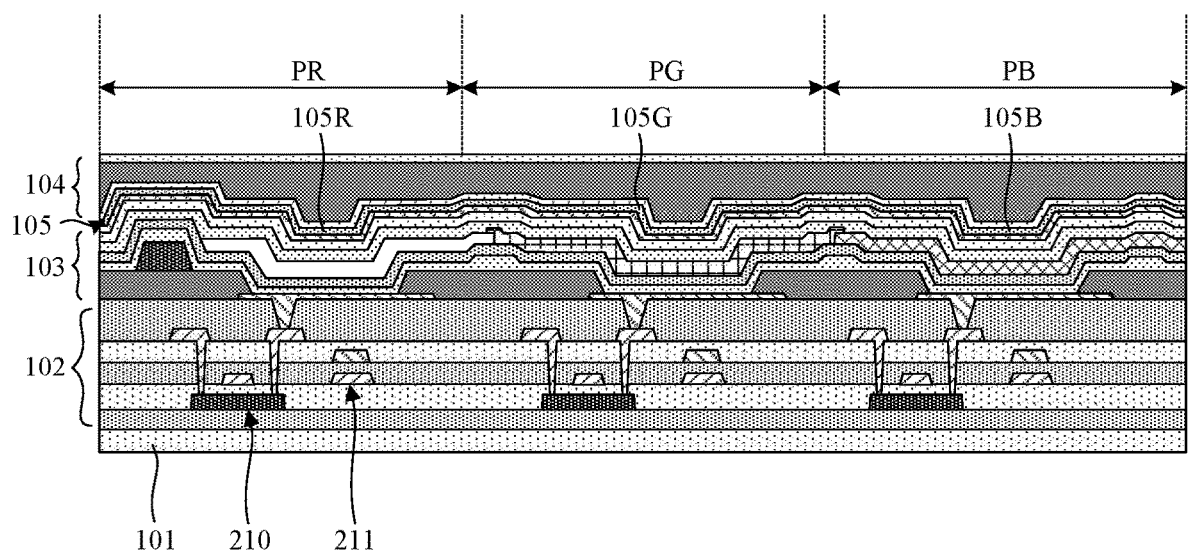
FIG. 8 is a schematic diagram of a structure of a display substrate according to an exemplary embodiment of the present disclosure.

FIG. 8 is a schematic diagram of a structure of a display substrate according to an exemplary embodiment of the present disclosure, showing a structure of three sub-pixels in an OLED display substrate. As shown in FIG. 8, in a plane perpendicular to the display substrate, a display substrate may include a drive circuit layer 102 disposed on a substrate 101, a light emitting structure layer 103 disposed on a side of the drive circuit layer 102 away from the substrate 101, a light modulation layer 105 disposed on a side of the light emitting structure layer 103 away from the substrate 101 and an encapsulation layer 104 disposed on a side of the light modulation layer 105 away from the substrate 101. In an exemplary embodiment, the drive circuit layer 103 may include a transistor 210 and a storage capacitor 211.

In an exemplary embodiment, a light modulation layer 105 may be referred to as a Capping Layer (CPL), and configured to extract light, adjust the reflectivity and transmittance of the emergent light, and adjust the length of the optical micro resonant cavity.

In an exemplary embodiment, a display substrate may include a red sub-pixel PR that emits red light, a green sub-pixel PG that emits green light, and a blue sub-pixel PB that emits blue light. The light modulation layer 105 may be isolated, and may include a red light modulation layer 105R, a green light modulation layer 105G, and a blue light modulation layer 105B that are sequentially arranged; wherein the red light modulation layer 105R is disposed on the red sub-pixel PR and is configured to extract red light, the green light modulation layer 105G is disposed on the green sub-pixel PG and is configured to extract green light, and the blue light modulation layer 105B is disposed on the blue sub-pixel PB and is configured to extract blue light.

In an exemplary embodiment, a red light modulation layer 105R may have a refractive index greater than or equal to 1.85, a green light modulation layer 105G may have a refractive index greater than or equal to 1.95, and a blue light modulation layer 105B may have a refractive index greater than or equal to 2.1. The present disclosure can effectively improve the light extraction efficiency of red light, green light, and blue light by providing modulation layers with different refractive indexes in different sub-pixels.

In an exemplary embodiment, a display substrate may include a red sub-pixel PR that emits red light, a green sub-pixel PG that emits green light, and a blue sub-pixel PB that emits blue light. A light modulation layer 105 may be a common layer, and the light modulation layers 105 of all sub-pixels have a connected structure, and the orthographic projection of the light modulation layer 105 on the substrate is continuous, that is, the light modulation layer 105 has a whole surface structure.

In an exemplary embodiment, the light modulation layer 105 with a connected structure has a refractive index nR in a wavelength range of 600 nm to 640 nm, a refractive index nG in a wavelength range of 510 nm to 550 nm, and a refractive index nB in a wavelength range of 440 nm to 480 nm, and the light modulation layer 105 with a connected structure satisfies:

$|nB-nG| \leq 0.1, |nB-nR| \leq 0.2.$

In the present disclosure, by setting the refractive index relationship of the light modulation layers of different sub-pixels, the difference in refractive index of the light modulation layers in the red sub-pixel PR, the green sub-pixel PG, and the blue sub-pixel PB is smaller. Under a same thickness, the light extraction efficiency of the light modulation layer for extracting red light, green light and blue light is relatively small. The efficiency of extracting red light, green light and blue light by the light modulation layer can be relatively balanced, and red light, green light and blue light can be optimized at the same time.

In an exemplary embodiment, a material of the light modulation layer may include, but is not limited to, a compound having a structure shown in Formula 2:

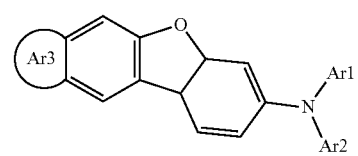

Formula 2

Wherein, Ar1 to Ar3 are independently substituted or unsubstituted aryl groups having 6 to 30 ring carbon atoms, or substituted or unsubstituted heteroaryl groups having 5 to 20 ring atoms.

In an exemplary embodiment, a compound of a structure shown in Formula 2 may be called dibenzofuran, which helps to increase the refractive index of the material.

In an exemplary embodiment, the light modulation layer may include one or more of a compound having the following structural formula:

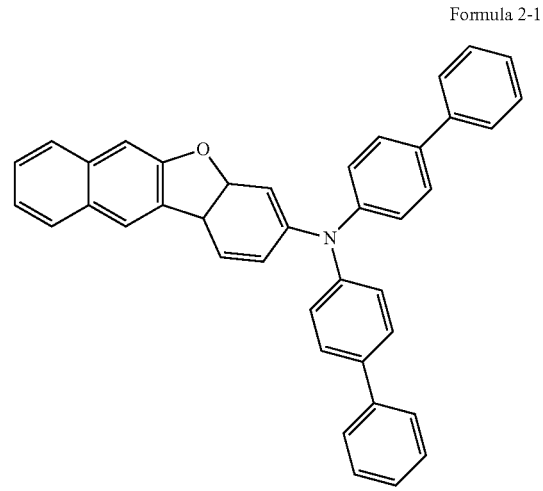

Formula 2-1

Formula 2-2

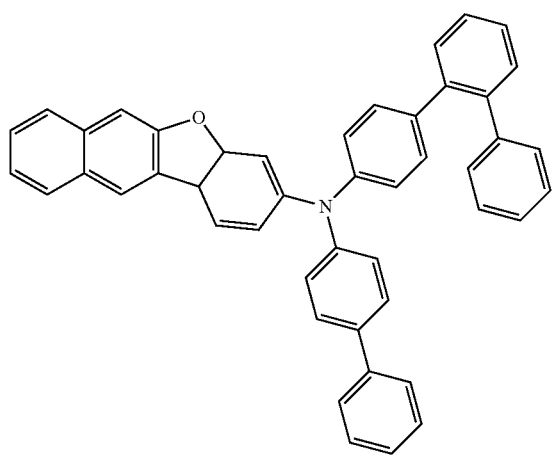

Formula 2-3

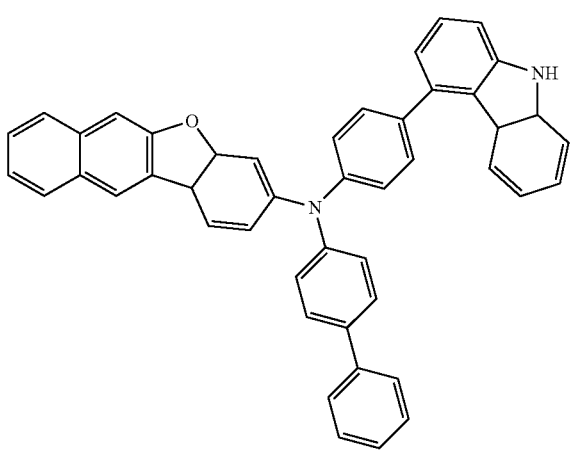

Formula 2-4

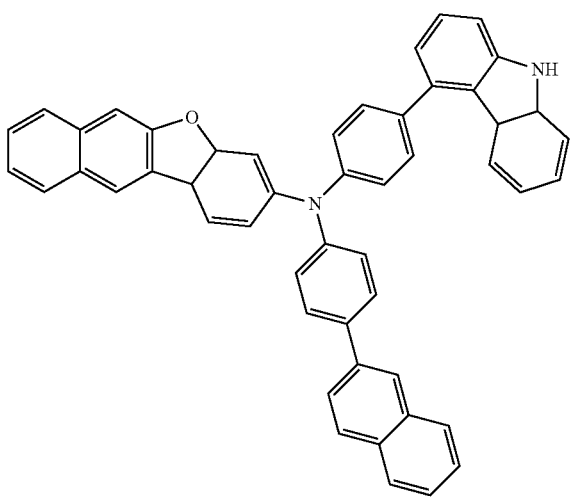

Formula 2-5

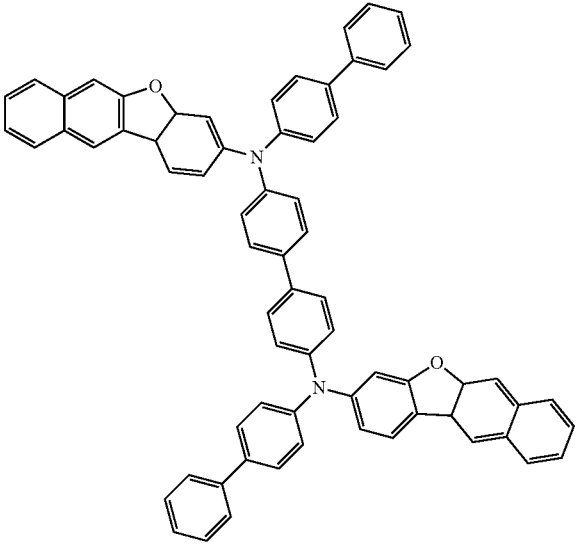

Formula 2-6

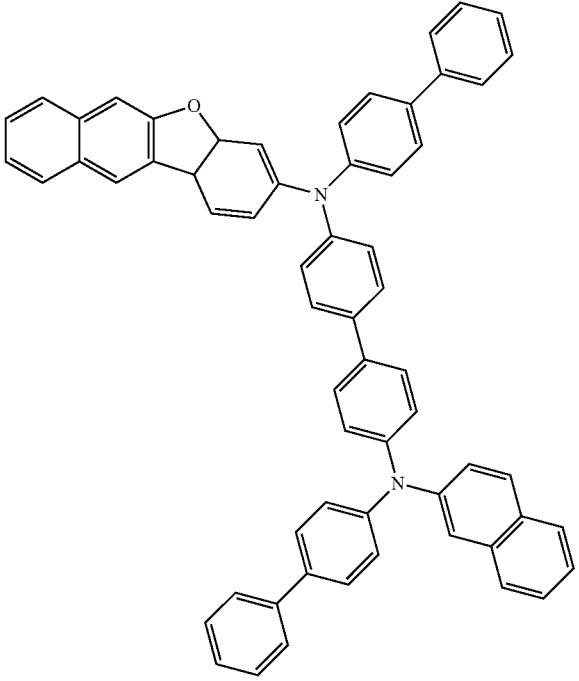

In an OLED display substrate, an encapsulation layer directly covers a cathode of a light emitting structure layer, which causes problems such as low light extraction efficiency. Exemplary embodiments of the present disclosure effectively improve the light extraction efficiency of an OLED display apparatus by providing a light modulation layer between a light emitting structure layer and an encapsulation structure layer. When light waves (electromagnetic waves) are incident on an interface between metal and dielectric, free electrons on the metal surface oscillate collectively, the electromagnetic waves are coupled with the free electrons on the metal surface to form near-field electromagnetic waves propagating along the metal surface. If the oscillation frequency of the electrons is consistent with the frequency of the incident light waves, resonance will occur. In the resonant state, the energy of the electromagnetic field is effectively transformed into the collective vibration energy of the free electrons on the metal surface. At this time, a special electromagnetic mode is formed: the electromagnetic field is limited to a small range on the metal surface and enhanced. This phenomenon is called Surface Plasmon Polariton (SPP) effect, which will reduce the light extraction efficiency. In this exemplary embodiment of the present disclosure, the light modulation layer is disposed on the cathode, thus effectively eliminating the SPP effect and improving the light extraction efficiency. Since the cathode has a transflective effect on the emergent light, the light modulation layer is disposed on the cathode, thus effectively adjusting the reflectivity and transmittance of the outgoing light, effectively adjusting the length of the optical micro resonant cavity, and improving the emergent light intensity. Exemplary embodiments of the present disclosure set the refractive index relationship of the light modulation layers of different sub-pixels, so that the light modulation layer can extract red light, green light, and blue light with a small difference in light extraction efficiency under the same thickness. The efficiency of extracting red light, green light and blue light by the light modulation layer can be relatively balanced, and red light, green light and blue light can be optimized at the same time, and the overall output light efficiency and output light intensity is maximized.

In an exemplary embodiment, the preparation process of the display substrate according to this embodiment is basically similar to the preparation process of the previous embodiment, the difference is that after the light emitting structure layer is prepared, an open mask is used to deposit or evaporate the light modulation layer on the display substrate. A common layer of the light modulation layer is formed, and then an encapsulation layer is formed on the light modulation layer.

Table 1 to Table 6 are the comparison results of related reference experiments. In a reference experiment, the structure of the display substrate of the Referenced Structure, the Referenced Structure 1 to the Referenced Structure 2, and the Structure 1 to the Structure 14 are all the drive circuit layer, the light emitting structure layer, the light modulation layer and the encapsulation layer which are sequentially arranged on the base, and the structure of the organic emitting layer is HIL/HTL/EBL/EML/HBL/ETL/EIL, The material and thickness of the Hole Injection Layer HIL, the Hole Transport Layer HTL, the Electron Block Layer EBL, the Emitting Layer EML, the Hole Block Layer HBL, and the Electron Injection Layer EIL in the above structure are the same. LT95@10000 nit in Table 1 indicates the time for OLED to decrease from 100% of initial brightness to 95% brightness. Since the life curve follows the multi-exponential decay model, the life of OLED may be estimated according to LT95.

In an exemplary embodiment, the same film layers in Referenced Structure, Referenced Structure 1 to Referenced Structure 2, Structure 1 to Structure 14 are:

| thin film layer | material |
| --- | --- |
| Hole Injection Layer HIL | 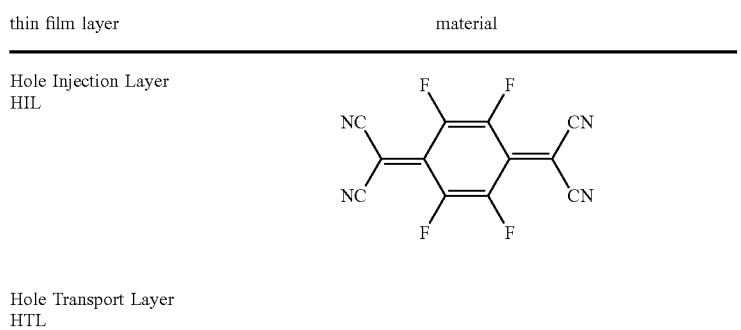 |
| Hole Transport Layer HTL | 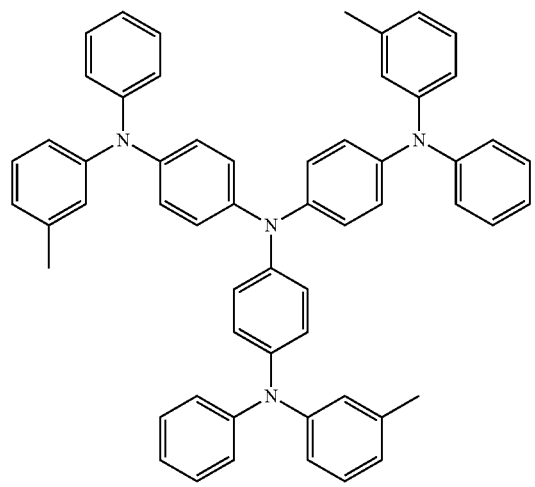 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1] |

-continued
| thin film layer | material |
|---|---|
| Electron Block Layer EBL | |
| host material of Emitting Layer | |
| dopant material of Emitting Layer | |
| Hole Block Layer HBL | |
| Electron Injection layer EIL | metal |
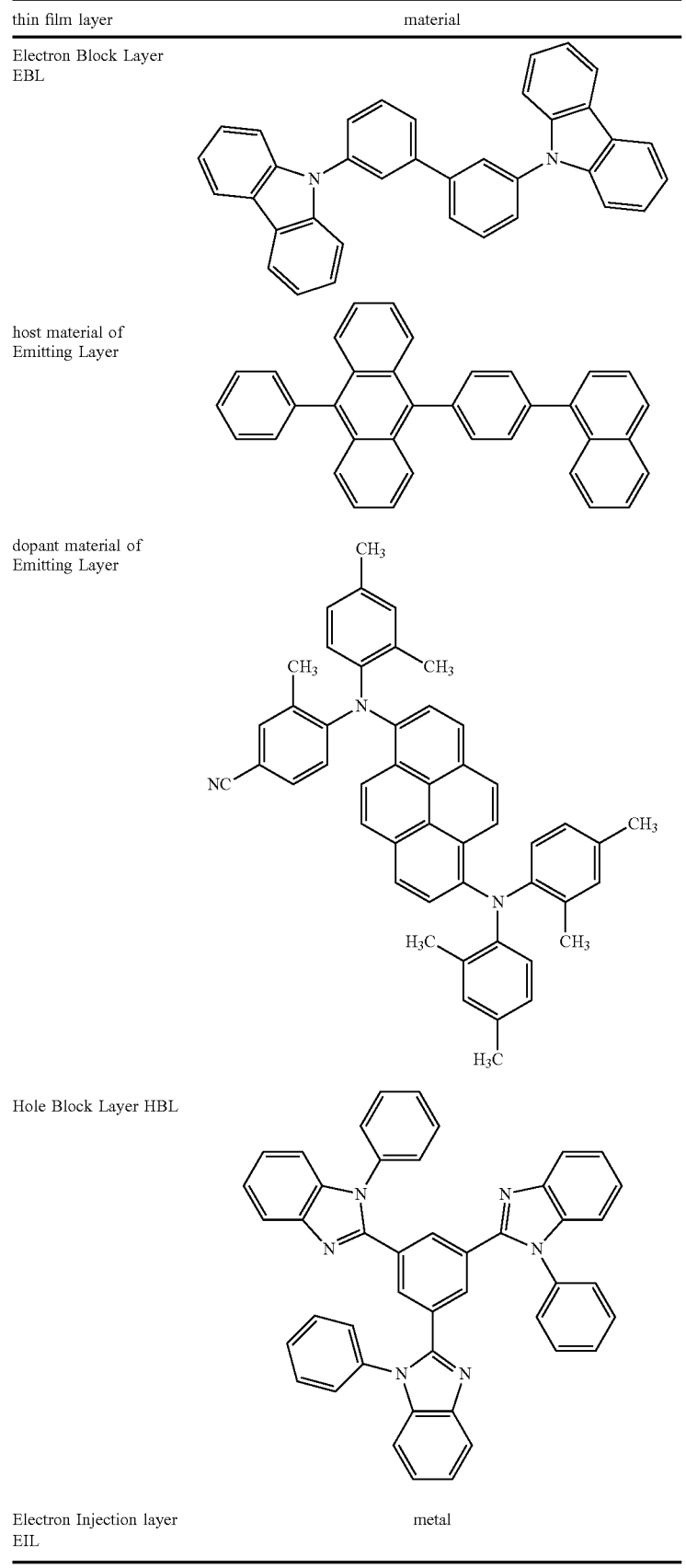

Table 1 is performance comparison results of a different Electron Transport Layer ETL material in an exemplary embodiment of the present disclosure. In a reference experiment, materials of light modulation layers the Referenced Structures and Structure 1 to Structure 2 are the same, and materials of an Electron Transport Layer ETL of the Referenced Structures and Structure 1 to Structure 2 are different, namely:

| structure | Electron Transport Layer ETL | light modulation layer CPL |
| --- | --- | --- |
| Referenced Structure | | |
| Structure 1 | Formula 1-1 | |
| Structure 2 | Formula 1-2 | |

TABLE 1

Performance Comparison Results of a Different Electron Transport Layer ETL Material

|  | voltage | efficiency | service life (LT95@10000nit) |
| --- | --- | --- | --- |
| Referenced Structure | 100% | 100% | 100% |
| Structure 1 | 97% | 102% | 114% |
| Structure 2 | 95% | 104% | 121% |

As shown in Table 1, compared with the Referenced Structure, since the electron transport layer materials of Structure 1 and Structure 2 use compounds of the structures shown in Formula 1-1 and Formula 1-2, both Structure 1 and Structure 2 are very obvious in terms of increasing the service life, and the efficiency is improved, and the voltage is reduced. Therefore, the exemplary embodiments of the present disclosure reasonably match the relationship between the energy level and the mobility of the hole block layer and the electron transport layer, and select the material of the electron transport layer, which effectively improves the service life.

Table 2 is performance comparison results of another different Electron Transport Layer ETL material in an exemplary embodiment of the present disclosure. In the comparison experiment, the light modulation layer and the electron transport layer of the Referenced Structure, Structures 3 to Structure 5 are as follows:

| structure | Electron Transport Layer ETL | light modulation layer CPL |
| --- | --- | --- |
| Referenced Structure | 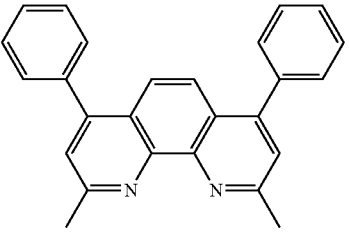 [SMILES: Cc1cc(-c2ccccc2)c2ccc3c(-c4ccccc4)cc(C)nc3c2n1] | 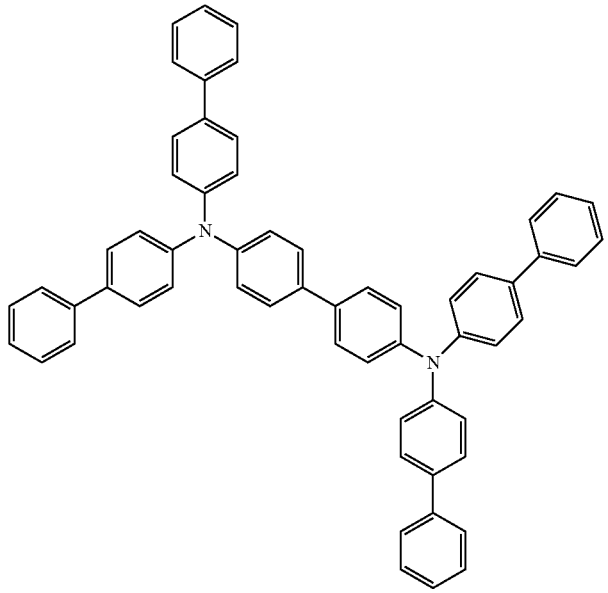 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] |
| Structure 3 | 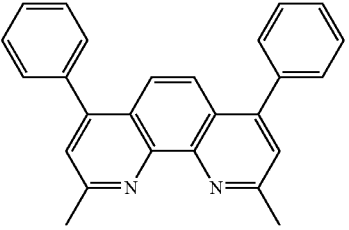 [SMILES: Cc1cc(-c2ccccc2)c2ccc3c(-c4ccccc4)cc(C)nc3c2n1] | |

| structure | Electron Transport Layer ETL | light modulation layer CPL |
|---|---|---|
| Structure 4 | 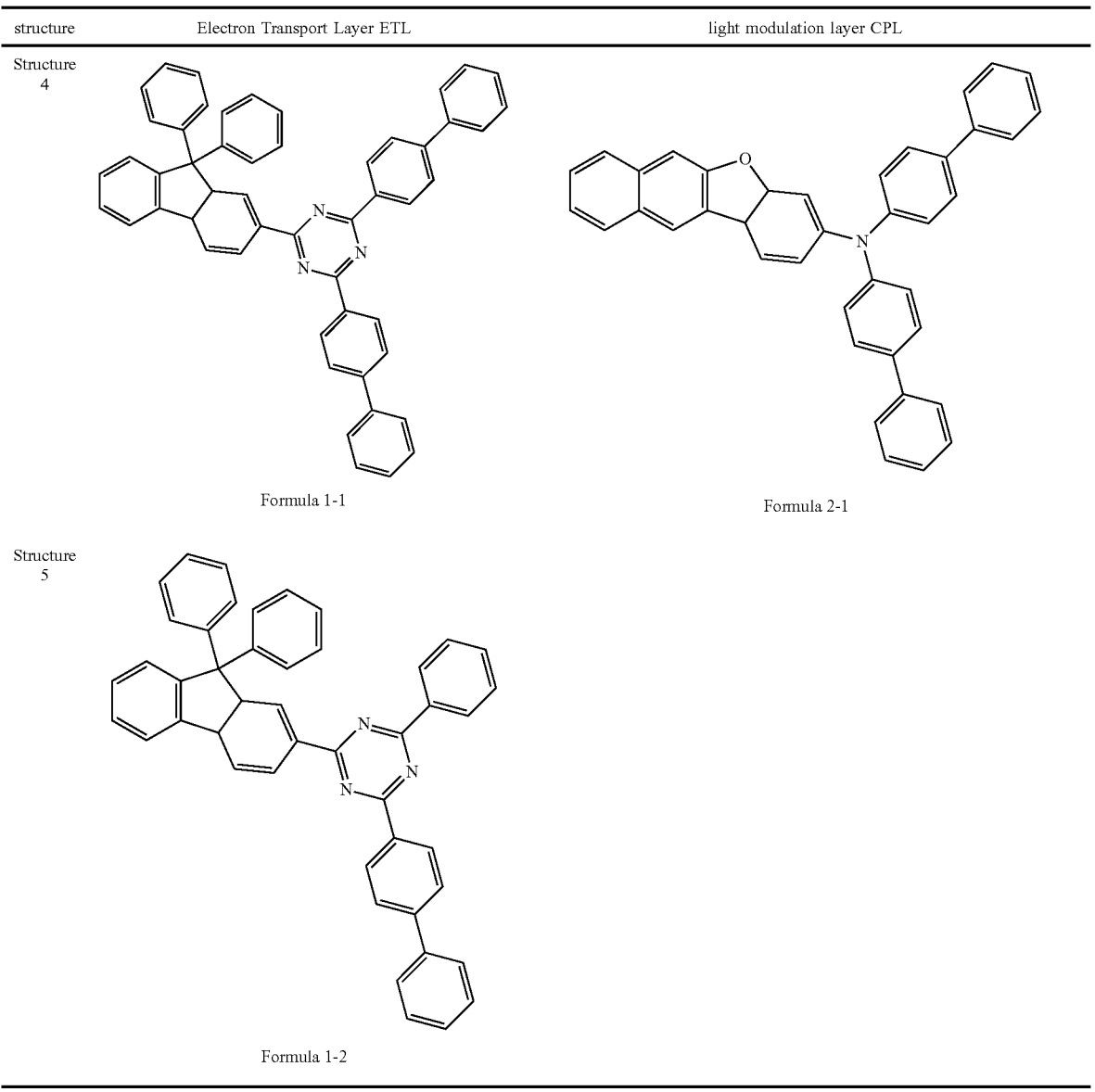 Formula 1-1 | Formula 2-1 |
| Structure 5 | Formula 1-2 | |

TABLE 2

Performance Comparison Results of another Different Electron Transport Layer ETL Material

| | voltage | efficiency | service life (LT95@10000nit) |
|---|---|---|---|
| Referenced Structure | 100% | 100% | 100% |
| Structure 3 | 99% | 109% | 101% |
| Structure 4 | 96% | 115% | 113% |
| Structure 5 | 95% | 117% | 126% |

As shown in Table 2, compared with the Referenced Structure, since the light modulation layer materials of Structure 3, Structure 4, and Structure 5 use the compound of the structure shown in Formula 2-1, Structure 3, Structure 4, and Structure 5 are all very obvious in terms of increasing efficiency. Since the electron transport layer materials of Structure 4 and Structure 5 use compounds of the structures shown in Formula 1-1 and Formula 1-2, both Structure 4 and Structure 5 are very obvious in terms of increasing the service life, and the voltage is reduced. Compared with Structure 3, the combined use of the material of the electron transport layer and the material of the light modulation layer can significantly improve the efficiency. Therefore, the exemplary embodiments of the present disclosure effectively improve efficiency by properly matching the materials of the electron transport layer and the light modulation layer, and effectively improve the service life by reasonably matching the energy level and mobility relationship of the hole block layer and the electron transport layer, and the materials of the electron transport layer.

Table 3 is performance comparison results of another different Electron Transport Layer ETL material in an exemplary embodiment of the present disclosure. In the comparison experiment, the light modulation layer and the electron transport layer of the Referenced Structure, Structures 6 to Structure 8 are as follows:

| structure | Electron Transport Layer ETL | light modulation layer CPL |
|---|---|---|
| Referenced Structure | 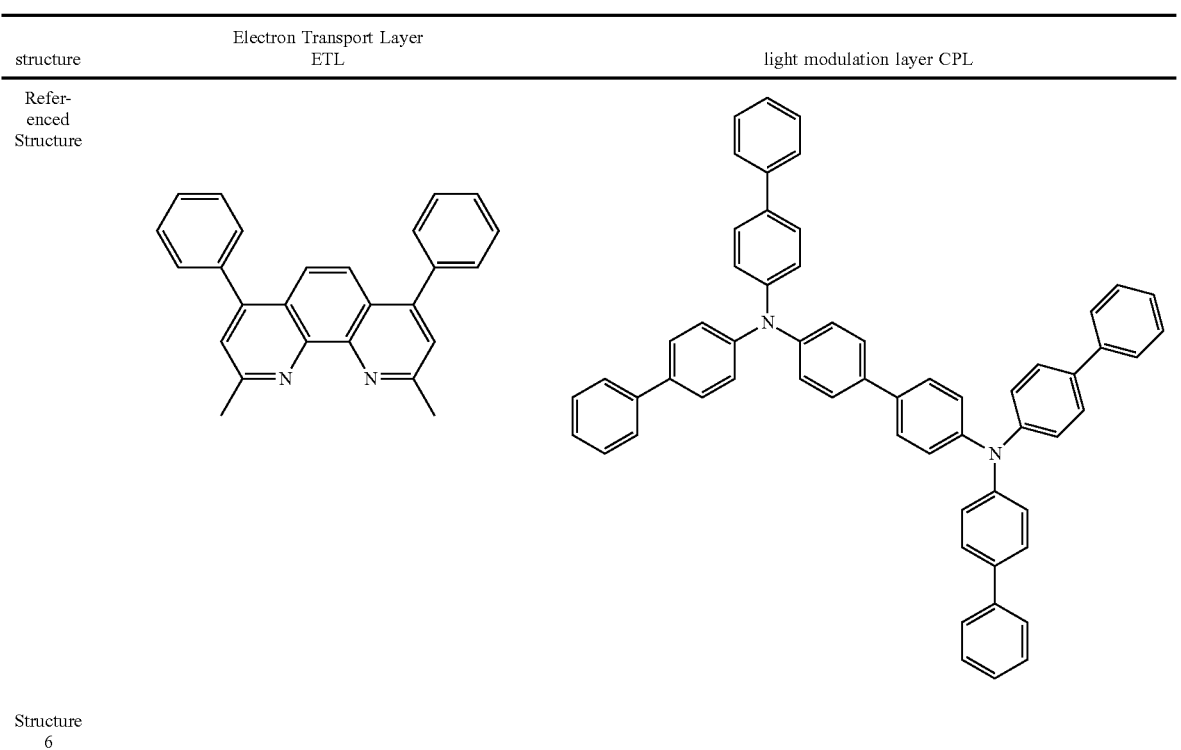 | |
| Structure 6 | 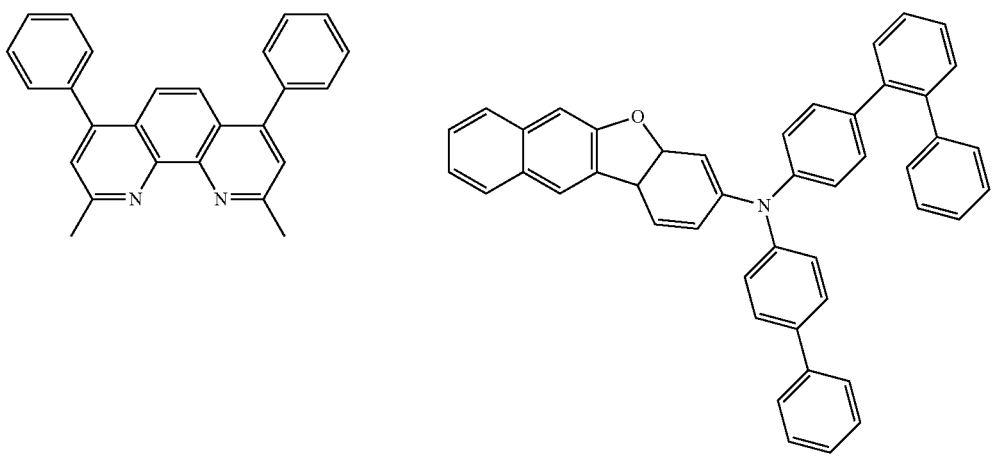 | Formula 2-2 |

| structure | Electron Transport Layer ETL | light modulation layer CPL |
|---|---|---|
| Structure 7 | Formula 1-1 | |
| Structure 8 | Formula 1-2 | |

TABLE 3

Performance Comparison Results of another Different Electron Transport Layer ETL Material

|  | voltage | efficiency | service life (LT95@10000nit) |
|---|---|---|---|
| Referenced Structure | 100% | 100% | 100% |
| Structure 6 | 100% | 113% | 101% |
| Structure 7 | 97% | 118% | 111% |
| Structure 8 | 96% | 129% | 119% |

As shown in Table 3, compared with the Referenced Structure, since the light modulation layer materials of Structure 6, Structure 7, and Structure 8 use the compound of the structure shown in Formula 2-2, Structure 6, Structure 7, and Structure 8 are all very obvious in terms of increasing efficiency. Since the electron transport layer materials of Structure 7 and Structure 8 use compounds of the structures shown in Formula 1-1 and Formula 1-2, both Structure 7 and Structure 8 are very obvious in terms of increasing the service life, and the voltage is reduced. Compared with Structure 6, the combined use of the material of the electron transport layer and the material of the light modulation layer can significantly improve the efficiency. Therefore, the exemplary embodiments of the present disclosure effectively improve efficiency by properly matching the materials of the electron transport layer and the light modulation layer, and effectively improve the service life by reasonably matching the energy level and mobility relationship of the hole block layer and the electron transport layer, and the materials of the electron transport layer.

Table 4 is performance comparison results of a different light modulation layer material in an exemplary embodiment of the present disclosure. In the comparison experiment, the light modulation layer and the electron transport layer of the Referenced Structure, Structures 9 to Structure 10 are as follows:
| structure | Electron Transport Layer ETL | light modulation layer CPL |
|---|---|---|
| Referenced Structure | 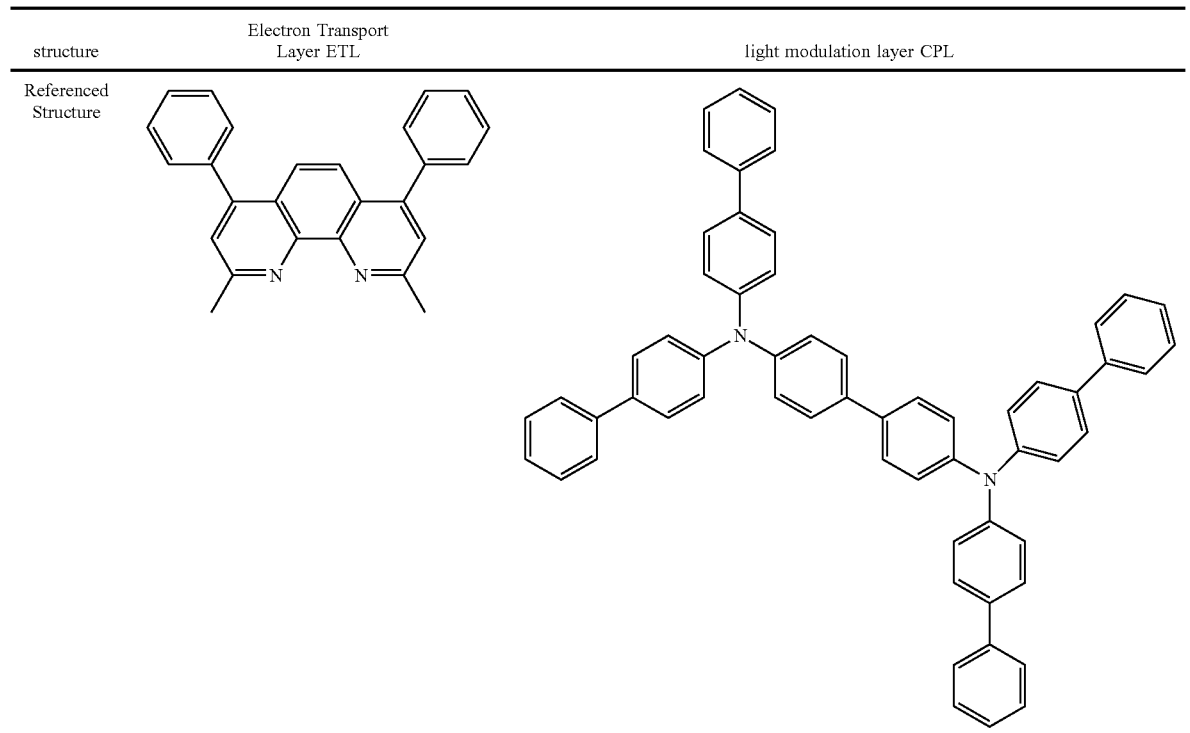 | |
Structure 9
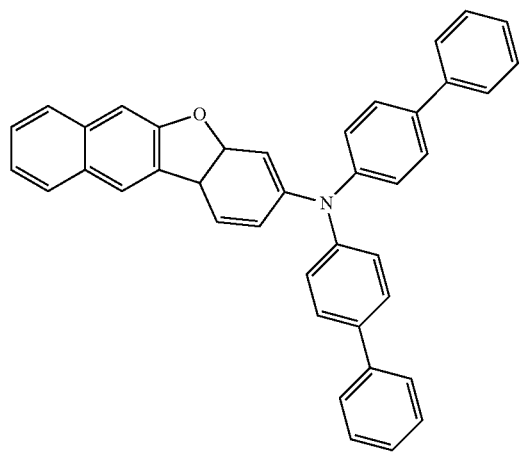
Formula 2-1

| structure | Electron Transport Layer ETL | light modulation layer CPL |
|---|---|---|
| Structure 10 | | 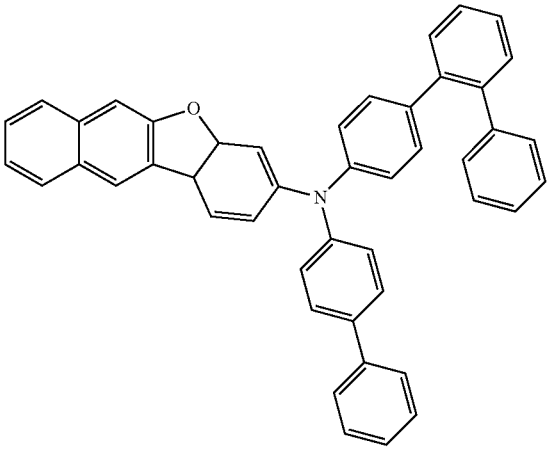<br>Formula 2-2 |

TABLE 4

Performance Comparison Results of a Different Light Modulation Layer Material

| | voltage | efficiency | service life (LT95@10000nit) |
|---|---|---|---|
| Referenced Structure | 100% | 100% | 100% |
| Structure 9 | 99% | 109% | 101% |
| Structure 10 | 100% | 113% | 101% |

As shown in Table 4, compared with the Referenced Structure, since the light modulation layer materials of Structure 9 and Structure 10 respectively use the compound of the structure shown in Formula 2-1 and Formula 2-2, Structure 9 and Structure 10 are all very obvious in terms of increasing efficiency. Therefore, the exemplary embodiments of the present disclosure effectively improve the efficiency by using a suitable material of the light modulation layer.

Table 5 is performance comparison results of another different light modulation layer material in an exemplary embodiment of the present disclosure. In the comparison experiment, the light modulation layer and the electron transport layer of the Referenced Structure 1, Structures 11 to Structure 12 are as follows:

| structure | Electron Transport Layer ETL | light modulation layer CPL |
|---|---|---|
| Referenced Structure 1 | 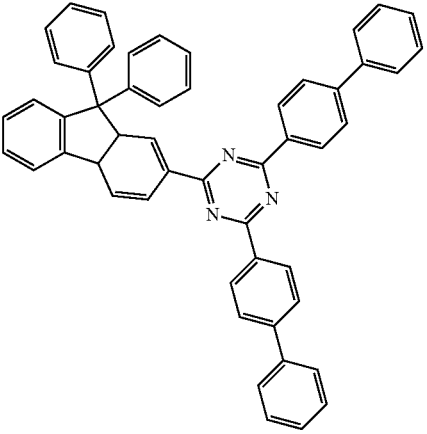<br>Formula 1-1 | 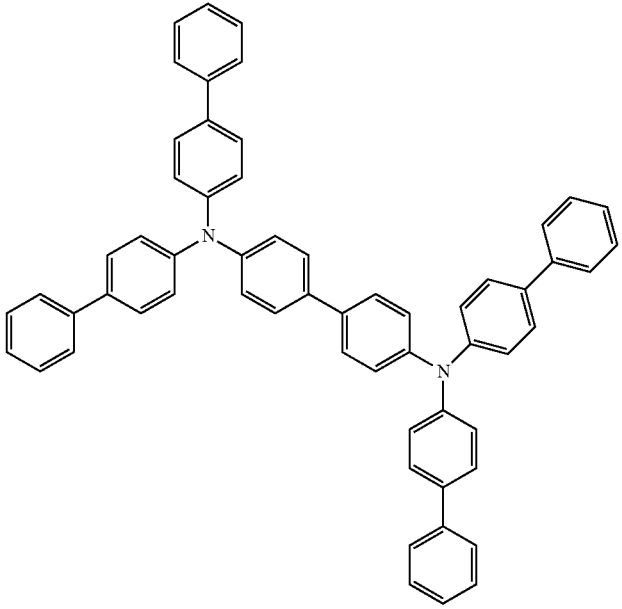 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] |

-continued

| structure | Electron Transport Layer ETL | light modulation layer CPL |
|---|---|---|
| Structure 9 | | 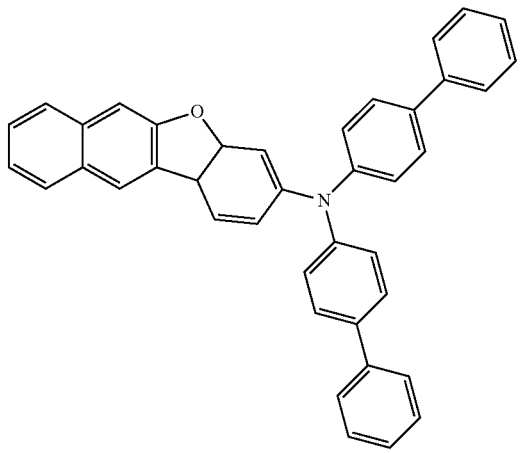<br>Formula 2-1 |
| Structure 10 | | 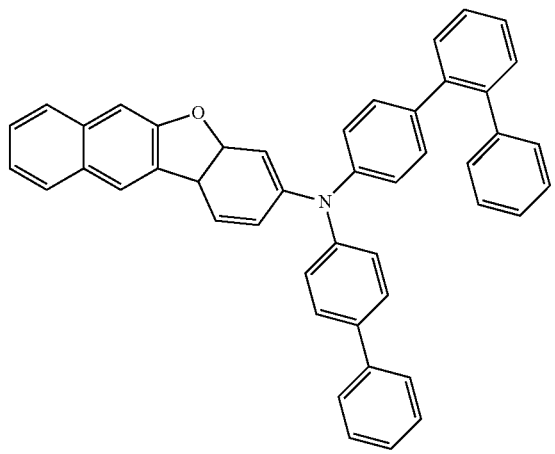<br>Formula 2-2 |

TABLE 5

Performance Comparison Results of another Different Light Modulation Layer Material

| | voltage | efficiency | service life (LT95@10000nit) |
|---|---|---|---|
| Referenced Structure 1 | 97% | 102% | 114% |
| Structure 11 | 96% | 115% | 113% |
| Structure 12 | 97% | 118% | 111% |

As shown in Table 5, compared with the Referenced Structure 1, since the light modulation layer materials of Structure 11 and Structure 12 respectively use the compound of the structure shown in Formula 2-1 and Formula 2-2, Structure 11 and Structure 12 are all very obvious in terms of increasing efficiency. Since the electron transport layer materials of Reference Structure 1, Structure 11 and Structure 12 use compounds of the structures shown in Formula 1-1, Reference Structure 1, Structure 11 and Structure 12 are very obvious in terms of increasing the service life, and the voltage is reduced.

Table 6 is performance comparison results of another different light modulation layer material in an exemplary embodiment of the present disclosure. In the comparison experiment, the light modulation layer and the electron transport layer of the Referenced Structure 2, Structures 13 to Structure 14 are as follows:

| structure | Electron Transport Layer ETL | light modulation layer CPL |
| --- | --- | --- |
| Referenced Structure 2 | 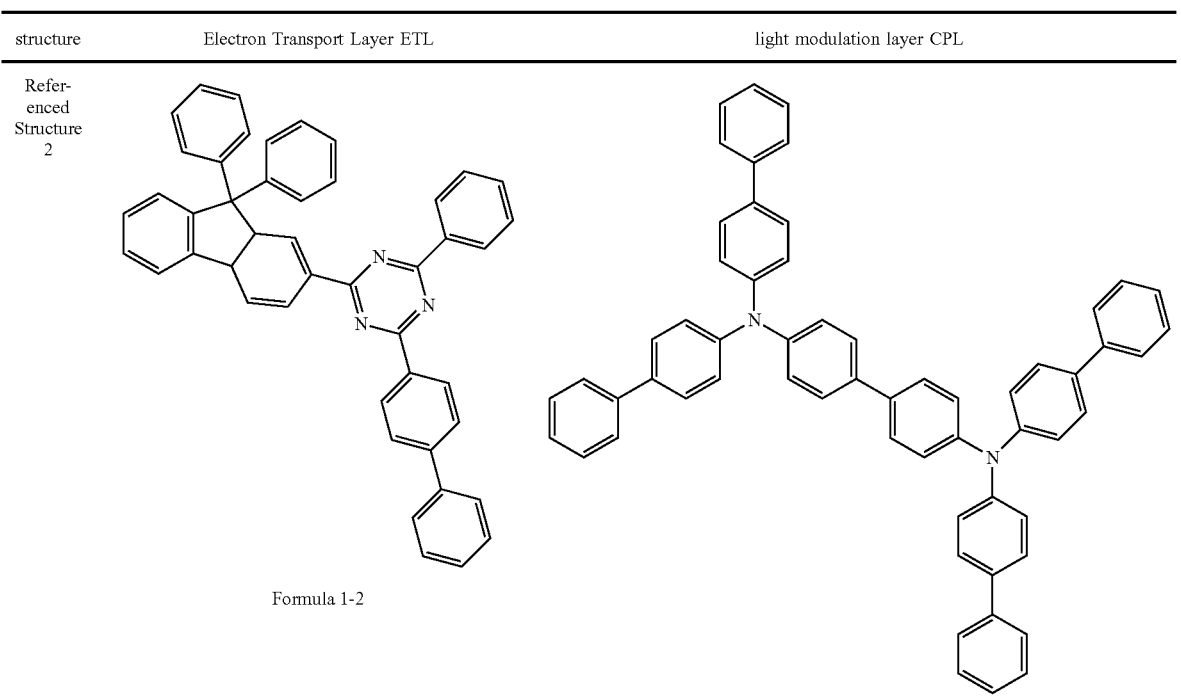 Formula 1-2 | |
| Structure 13 | | 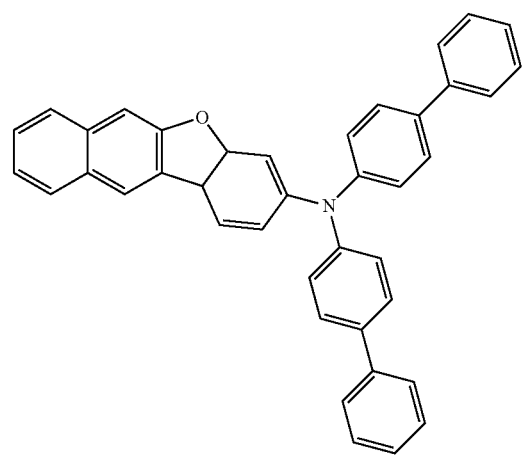 Formula 2-1 |

| structure | Electron Transport Layer ETL | light modulation layer CPL |
|---|---|---|
| Structure 14 | | 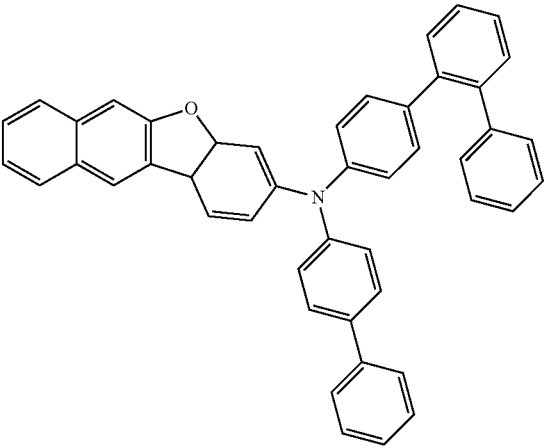<br>Formula 2-2 |

TABLE 6

Performance Comparison Results of another Different Light Modulation Layer Material

| | voltage | efficiency | service life (LT95@10000nit) |
|---|---|---|---|
| Referenced Structure 2 | 95% | 104% | 121% |
| Structure 13 | 95% | 117% | 126% |
| Structure 14 | 96% | 129% | 119% |

As shown in Table 6, compared with the Referenced Structure 2, since the light modulation layer materials of Structure 13 and Structure 14 respectively use the compound of the structure shown in Formula 2-1 and Formula 2-2, Structure 13 and Structure 14 are all very obvious in terms of increasing efficiency. Since the electron transport layer materials of Reference Structure 2, Structure 13 and Structure 14 use compounds of the structures shown in Formula 1-2, Reference Structure 2, Structure 13 and Structure 14 are very obvious in terms of increasing the service life, and the voltage is reduced.

Exemplary embodiments of the present disclosure provide a display substrate, Reasonably matching the mobility relationship, energy level relationship, or energy level and mobility relationship between the hole block layer and the electron transport layer can not only control the density of electrons injected into the emitting layer, but also slow down the transmission of electrons to the emitting layer, so that the recombination region can be far away from the EBL/EML interface, which reduces the damage of the electron block layer. Therefore, the material stability of the electron block layer is improved, the material deterioration and performance degradation caused by electron accumulation are reduced, the life of the device is increased, and holes can be effectively blocked from passing through the hole block layer and the electron transport layer, and electron quenching is avoided, improving the luminance efficiency. The exemplary embodiments of the present disclosure increase the stability and service life of the device by adopting the electron transport layer material with a small degree of crystallinity. In the exemplary embodiments of the present disclosure, by setting the refractive index relationship of the light modulation layers of different sub-pixels, the difference in refractive index of the light modulation layers in the red sub-pixel, the green sub-pixel, and the blue sub-pixel is smaller. Under a same thickness, the light extraction efficiency of the light modulation layer for extracting red light, green light and blue light is relatively small. The efficiency of extracting red light, green light and blue light by the light modulation layer can be relatively balanced, and red light, green light and blue light can be optimized at the same time. The exemplary embodiments of the present disclosure effectively improve efficiency through the use of the electron transport layer material and the light modulation layer material in combination.

The present disclosure further provides a display apparatus, which includes the display substrate. The display apparatus may be any product or component with a display function, such as mobile phone, tablet computer, TV, display, notebook computer, digital photo frame, navigator, vehicle-mounted display, smart watch or smart bracelet.

Although the implementations of the present disclosure are disclosed above, the contents are only implementations adopted to easily understand the present disclosure and not intended to limit the present disclosure. Any person skilled in the field to which the present application pertains can make any modifications and variations in the forms and details of implementation without departing from the spirit and the scope disclosed in the present application, but the patent protection scope of the present application should still be subject to the scope defined by the appended claims.

The invention claimed is:

1. A display substrate comprising a drive circuit layer and a light emitting structure layer stacked on a substrate, wherein the light emitting structure layer comprises an anode, a cathode, and an emitting layer, a hole block layer, and an electron transport layer disposed between the anode and the cathode; the hole block layer and the electron transport layer satisfy:

$EETL/EHBL > 1;$ where EETL is the electromigration rate of the electron transport layer, and EHBL is the electromigration rate of the hole block layer;

wherein the material of the hole block layer comprises one or more of a compound having the following structural formula:

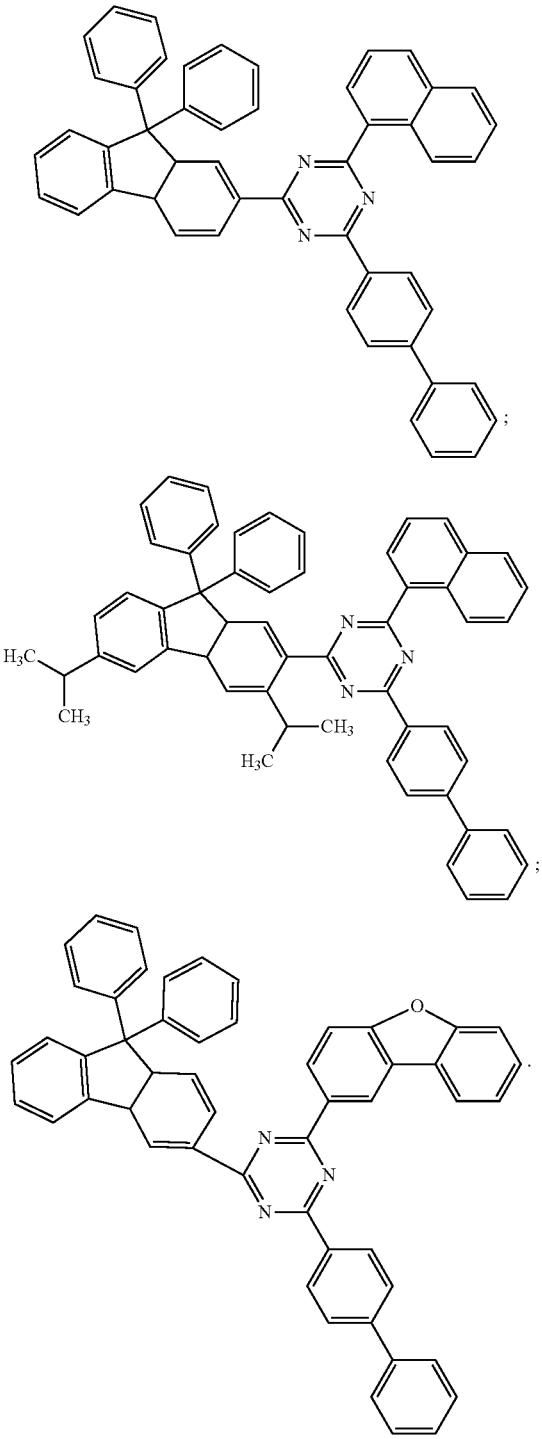

2. The display substrate according to claim 1, wherein the hole block layer and the electron transport layer satisfy:

|HOMOETL−HOMOHBL|≥0.1 Ev;

wherein HOMOETL is a Highest Occupied Molecular Orbital (HOMO) energy level of the electron transport layer and HOMOHBL is a HOMO energy level of the hole block layer.

3. The display substrate according to claim 1, wherein the hole block layer and the electron transport layer satisfy:

|LUMOETL−LUMOHBL|≥0.2 eV;

wherein LUMOETL is the Lowest Unoccupied Molecular Orbital (LUMO) energy level of the electron transport layer, and LUMOHBL is the LUMO energy level of the hole block layer.

4. The display substrate according to claim 1, wherein the electromigration rate of the electron transport layer is $10^{-7}$ cm$^2$/Vs to $10^{-5}$ cm$^2$/Vs, and the electromigration rate of the hole block layer is $10^{-8}$ cm$^2$/Vs to $10^{-7}$ cm$^2$/Vs.

5. The display substrate according to claim 1, wherein the display substrate further comprises a light modulation layer disposed on a side of the light emitting structure layer away from the substrate; the light modulation layer has a refractive index nR in a wavelength range of 600 nm to 640 nm, a refractive index nG in a wavelength range of 510 nm to 550 nm, and a refractive index nB in a wavelength range of 440 nm to 480 nm, and the light modulation layer satisfies:

|nB−nG|≤0.1,|nB−nR|≤0.2.

6. The display substrate according to claim 5, wherein the light modulation layer has a refractive index refractive index greater than or equal to 1.85 in a wavelength range of 600 nm to 640 nm, a refractive index greater than or equal to 1.95 in a wavelength range of 510 nm to 550 nm, and a refractive index greater than or equal to 2 in a wavelength range of 440 nm to 480 nm.

7. The display substrate according to claim 5, wherein the material of the light modulation layer comprises a compound having the following structural formula:

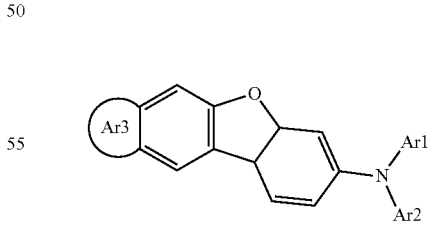

wherein, Ar1 to Ar3 are independently substituted or unsubstituted aryl groups having 6 to 30 ring carbon atoms, or substituted or unsubstituted heteroaryl groups having 5 to 20 ring atoms.

8. The display substrate according to claim 5, wherein the material of the light modulation layer comprises one or more of a compound having the following structural formula:

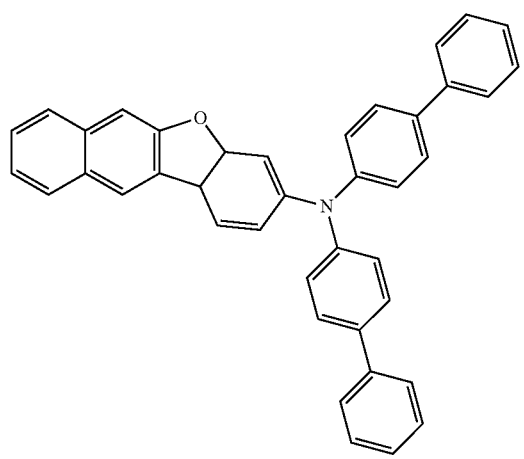
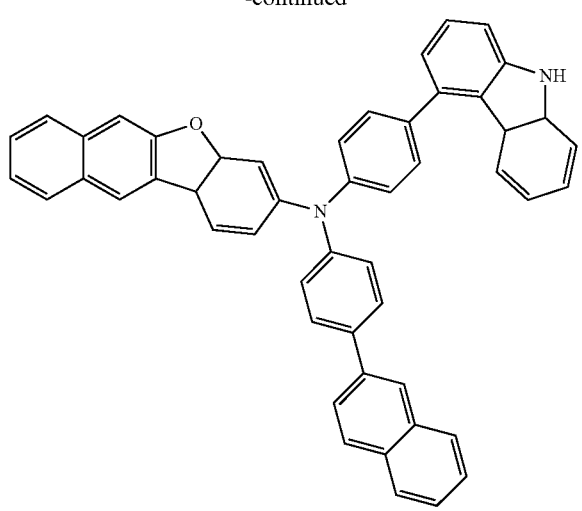
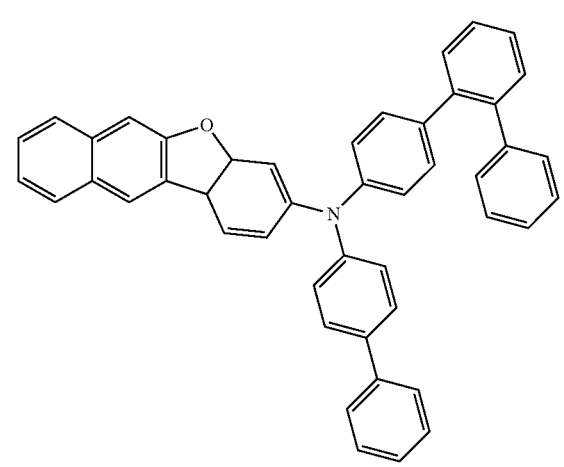
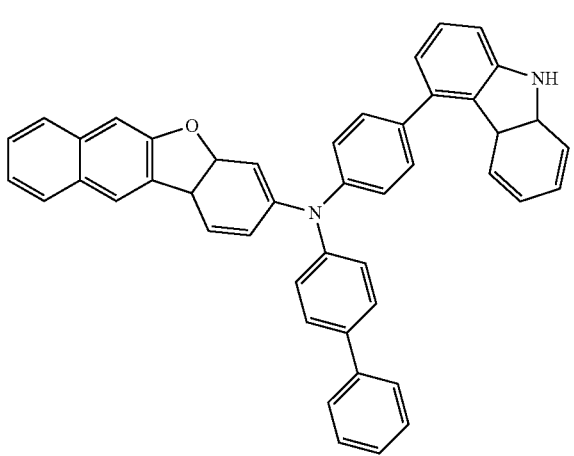
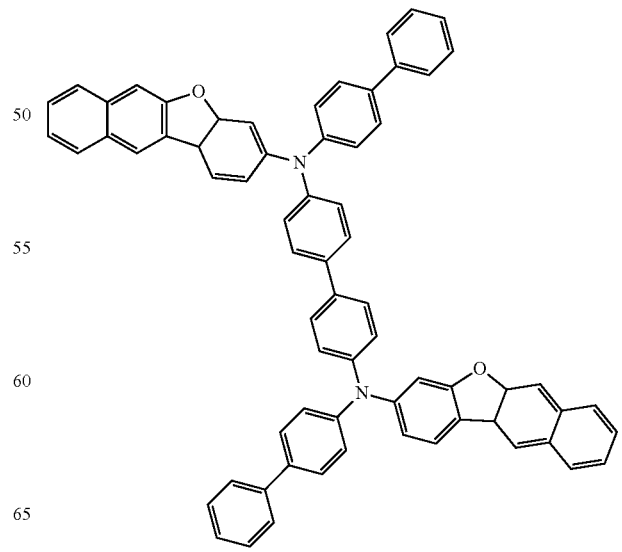

-continued

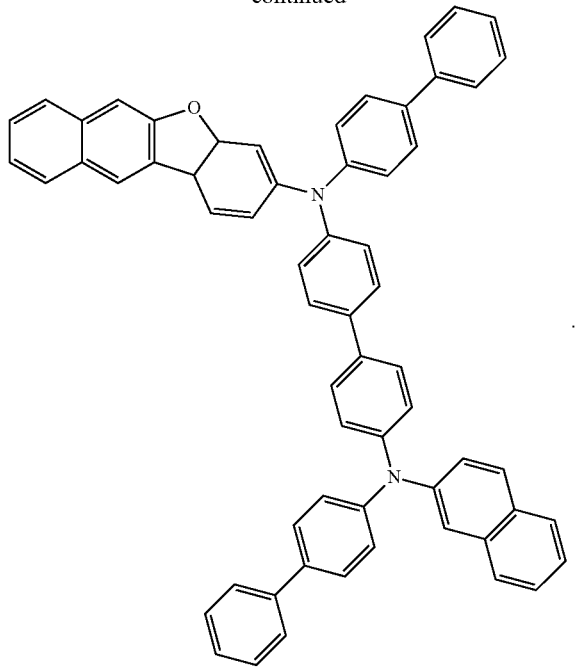

9. A display apparatus, comprising the display substrate according to claim 1.

10. The display substrate according to claim 2, wherein the display substrate further comprises a light modulation layer disposed on a side of the light emitting structure layer away from the substrate; the light modulation layer has a refractive index nR in a wavelength range of 600 nm to 640 nm, a refractive index nG in a wavelength range of 510 nm to 550 nm, and a refractive index nB in a wavelength range of 440 nm to 480 nm, and the light modulation layer satisfies:

$|nB-nG|\leq 0.1, |nB-nR|\leq 0.2.$

11. The display substrate according to claim 3, wherein the display substrate further comprises a light modulation layer disposed on a side of the light emitting structure layer away from the substrate; the light modulation layer has a refractive index nR in a wavelength range of 600 nm to 640 nm, a refractive index nG in a wavelength range of 510 nm to 550 nm, and a refractive index nB in a wavelength range of 440 nm to 480 nm, and the light modulation layer satisfies:

$|nB-nG|\leq 0.1, |nB-nR|\leq 0.2.$

12. The display substrate according to claim 4, wherein the display substrate further comprises a light modulation layer disposed on a side of the light emitting structure layer away from the substrate; the light modulation layer has a refractive index nR in a wavelength range of 600 nm to 640 nm, a refractive index nG in a wavelength range of 510 nm to 550 nm, and a refractive index nB in a wavelength range of 440 nm to 480 nm, and the light modulation layer satisfies:

$|nB-nG|\leq 0.1, |nB-nR|\leq 0.2.$

* * * * *